(12) United States Patent
Ikeda et al.

(10) Patent No.: US 10,236,264 B2
(45) Date of Patent: Mar. 19, 2019

(54) WIRELESS IC DEVICE, RESIN MOLDED BODY COMPRISING SAME, COMMUNICATION TERMINAL APPARATUS COMPRISING SAME, AND METHOD OF MANUFACTURING SAME

(71) Applicant: Murata Manufacturing Co., Ltd., Nagaokakyo-shi, Kyoto-fu (JP)

(72) Inventors: Naoto Ikeda, Nagaokakyo (JP); Shunji Mandai, Nagaokakyo (JP); Yoichi Saito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 66 days.

(21) Appl. No.: 15/234,227

(22) Filed: Aug. 11, 2016

(65) Prior Publication Data

US 2016/0351514 A1 Dec. 1, 2016

Related U.S. Application Data

(63) Continuation of application No. PCT/JP2016/053345, filed on Feb. 4, 2016.

(30) Foreign Application Priority Data

Mar. 6, 2015 (JP) .................... 2015-045170

(51) Int. Cl.
*G06K 19/00* (2006.01)
*H01L 23/66* (2006.01)
(Continued)

(52) U.S. Cl.
CPC ............ *H01L 23/66* (2013.01); *G06K 19/077* (2013.01); *H01L 21/4853* (2013.01);
(Continued)

(58) Field of Classification Search
CPC .............. G06K 19/077; H01L 21/4853; H01L 23/49811; H01L 23/49822;
(Continued)

(56) References Cited

U.S. PATENT DOCUMENTS

2011/0062244 A1* 3/2011 Kato ................ G06K 19/07749
235/492
2012/0326931 A1 12/2012 Murayama et al.
2013/0229275 A1 9/2013 Nakatani

FOREIGN PATENT DOCUMENTS

GB 2461443 A 1/2010
JP 2007-102348 A 4/2007
(Continued)

OTHER PUBLICATIONS

Official Communication issued in corresponding International Application PCT/JP2016/053345, dated Apr. 12, 2016.
(Continued)

*Primary Examiner* — Daniel A Hess
(74) *Attorney, Agent, or Firm* — Keating & Bennett, LLP

(57) ABSTRACT

A wireless IC device includes an element body including first and second principal surfaces, an RFIC element buried in the element body, and an antenna coil disposed in the element body. The antenna coil includes a first wiring pattern provided on the second principal surface, a first metal pin reaching the first principal surface and the second principal surface, a second metal pin reaching the first principal surface and the second principal surface, and a second wiring pattern provided on the first principal surface. Terminal surfaces of the first input/output terminal and the second input/output terminal of the RFIC element face the second principal surface of the element body and are spaced away from the antenna coil while being connected to the first wiring pattern through first and second conductors extending
(Continued)

from the second principal surface of the element body in a direction of the first primary surface.

20 Claims, 21 Drawing Sheets

(51) Int. Cl.
| | | |
|---|---|---|
| *G06K 19/077* | (2006.01) | |
| *H01L 21/48* | (2006.01) | |
| *H01L 23/498* | (2006.01) | |
| *H01L 23/00* | (2006.01) | |
| *H01L 23/31* | (2006.01) | |
| *H01Q 1/22* | (2006.01) | |
| *H01Q 7/00* | (2006.01) | |

(52) U.S. Cl.
CPC .. *H01L 23/49811* (2013.01); *H01L 23/49822* (2013.01); *H01L 23/49833* (2013.01); *H01L 23/49838* (2013.01); *H01L 24/17* (2013.01); *H01L 23/3107* (2013.01); *H01L 24/13* (2013.01); *H01L 24/16* (2013.01); *H01L 24/81* (2013.01); *H01L 2223/6677* (2013.01); *H01L 2224/133* (2013.01); *H01L 2224/13144* (2013.01); *H01L 2224/13294* (2013.01); *H01L 2224/16225* (2013.01); *H01L 2224/16227* (2013.01); *H01L 2224/16265* (2013.01); *H01L 2224/81192* (2013.01); *H01L 2224/81205* (2013.01); *H01L 2224/81815* (2013.01); *H01L 2924/1421* (2013.01); *H01L 2924/19041* (2013.01); *H01L 2924/19042* (2013.01); *H01L 2924/19102* (2013.01); *H01L 2924/19105* (2013.01); *H01L 2924/19106* (2013.01); *H01Q 1/2208* (2013.01); *H01Q 7/00* (2013.01)

(58) Field of Classification Search
CPC ......... H01L 23/49833; H01L 23/49838; H01L 24/17; H01L 23/66
USPC ........................................................ 235/492
See application file for complete search history.

(56) References Cited

FOREIGN PATENT DOCUMENTS

| | | |
|---|---|---|
| JP | 4535210 B2 | 9/2010 |
| JP | 2012-105062 A | 5/2012 |
| JP | 2013-077237 A | 4/2013 |
| JP | 2014-93675 A | 5/2014 |
| WO | 2008/133018 A1 | 11/2008 |
| WO | 2009/145218 A1 | 12/2009 |
| WO | 2011/108340 A1 | 9/2011 |

OTHER PUBLICATIONS

Official Communication issued in Japanese Patent Application No. 2016-177810, dated May 9, 2017.

\* cited by examiner

WIRELESS IC DEVICE, RESIN MOLDED BODY COMPRISING SAME, COMMUNICATION TERMINAL APPARATUS COMPRISING SAME, AND METHOD OF MANUFACTURING SAME

CROSS REFERENCE TO RELATED APPLICATIONS

This application claims the benefit of priority to Japanese Patent Application 2015-045170 filed Mar. 6, 2015 and is a Continuation Application of PCT/JP2016/053345 filed on Feb. 4, 2016, the entire contents of each application are hereby incorporated herein by reference.

BACKGROUND OF THE INVENTION

1. Field of the Invention

The present invention relates to a wireless IC device preferably for use in short-range wireless communication apparatuses etc. such as an RFID (radio frequency identification) tag.

2. Description of the Related Art

Although RFID tags for the HF band are typically card-sized, small-sized RFID tags having a smaller occupation area may be required for commodity management. For the HF-band RFID tags, RFID tags utilizing a so-called sheet lamination construction method are known (see, e.g., Japanese Laid-Open Patent Publication No. 2007-102348, International Publication No. 2011/108340 and Japanese Patent No. 4535210).

The RFID tags disclosed in Japanese Laid-Open Patent Publication No. 2007-102348 and International Publication No. 2011/108340 have a lamination type antenna coil built into a multilayer substrate, and an RFIC element is mounted on the multilayer substrate. The RFID tag disclosed in Japanese Patent No. 4535210 has a plurality of interlayer connection conductors connected in a thickness direction of a multilayer substrate to form an antenna coil, and an RFIC element is mounted on the multilayer substrate.

In the RFID tags disclosed in Japanese Laid-Open Patent Publication No. 2007-102348 and International Publication No. 2011/108340, a mounting surface for mounting the RFIC element intersects with a winding axis of the antenna coil and, therefore, electrodes for mounting an RFIC chip and the RFIC element tend to interfere with formation of a magnetic field by the antenna coil. If the RFIC element is disposed outside the opening of the coil, the interference with the magnetic field formation hardly occurs; however, an occupation area is made larger.

In the RFID tag disclosed in Japanese Patent No. 4535210, the antenna coil is formed by laminating a plurality of base material layers having via-hole type interlayer connection conductors to form connection parts in the thickness direction of the multilayer substrate. Therefore, an open fault easily occurs due to a lamination deviation of the base material layers, which makes it difficult to ensure the reliability of electric connection of the interlayer connection conductors. If the base material layers are increased in thickness to reduce the number of the interlayer connection conductors, the interlayer connection conductors are increased in diameter.

SUMMARY OF THE INVENTION

Preferred embodiments of the present invention provide a wireless IC device that reduces interference with a magnetic field of an antenna coil by an RFIC element and has excellent electric characteristics, a resin molded body including the same, a communication terminal apparatus including the same, and a method of manufacturing the same.

A wireless IC device according to a preferred embodiment of the present invention includes an element body including a first principal surface and a second principal surface opposite to the first principal surface; an RFIC element buried in the element body and including a first input/output terminal and a second input/output terminal; and an antenna coil disposed in the element body and having one end connected to the first input/output terminal and the other end connected to the second input/output terminal, the antenna coil including a first wiring pattern provided on the second principal surface side of the element body and connected to the first input/output terminal and the second input/output terminal of the RFIC element, a first metal pin including a first end and a second end reaching the first principal surface and the second principal surface of the element body and connected at the first end to the first wiring pattern, a second metal pin including a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element including terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

A resin molded body according to a preferred embodiment of the present invention is a resin molded body including a wireless IC device, the wireless IC device including an element body including a first principal surface and a second principal surface opposite to the first principal surface, an RFIC element buried in the element body and including a first input/output terminal and a second input/output terminal, and an antenna coil disposed in the element body and having one end connected to the first input/output terminal and the other end connected to the second input/output terminal, the antenna coil including a first wiring pattern provided on the second principal surface side of the element body and connected to the first input/output terminal and the second input/output terminal of the RFIC element, a first metal pin having a first end and a second end reaching the first principal surface and the second principal surface of the element body and connected at the first end to the first wiring pattern, a second metal pin having a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element including terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

A communication terminal apparatus according to a preferred embodiment of the present invention includes a wireless IC device including an element body including a first principal surface and a second principal surface opposite to the first principal surface, an RFIC element buried in the element body and including a first input/output terminal and a second input/output terminal, and an antenna coil disposed in the element body and having one end connected to the first input/output terminal and the other end connected to the second input/output terminal, the antenna coil including a first wiring pattern provided on the second principal surface side of the element body and connected to the first input/output terminal and the second input/output terminal of the RFIC element, a first metal pin including a first end and a second end reaching the first principal surface and the second principal surface of the element body and connected at the first end to the first wiring pattern, a second metal pin including a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element including terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

A method of manufacturing a wireless IC device according to a preferred embodiment of the present invention includes the steps of arranging a first conductor and a second conductor standing on an adhesive layer disposed on a pedestal, the first conductor being connected to a first input/output terminal of an RFIC element, the second conductor being connected to a second input/output terminal of the RFIC element; arranging on the adhesive layer a first metal pin including a first end and a second end as well as a second metal pin including a third end and a fourth end, the first metal pin and the second metal pin standing with the first end side and the third end side located on the adhesive layer side, coating with an element body the RFIC element, the first conductor, the second conductor, the first metal pin, and the second metal pin arranged on the adhesive layer; forming on a first principal surface side of the element body a second wiring pattern connecting the second end of the first metal pin and the fourth end of the second metal pin; removing the pedestal provided with the adhesive layer to form on a second principal surface side of the element body a first wiring pattern connecting the first end of the first metal pin and the third end of the second metal pin while connecting the first conductor and the first end of the first metal pin as well as connecting the second conductor and the third end of the second metal pin.

Preferred embodiments of the present invention provide a wireless IC device that reduces interference with the magnetic field of the antenna coil by the RFIC element and has excellent electric characteristics, the resin molded body including the same, the communication terminal apparatus including the same, and the method of manufacturing the same.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
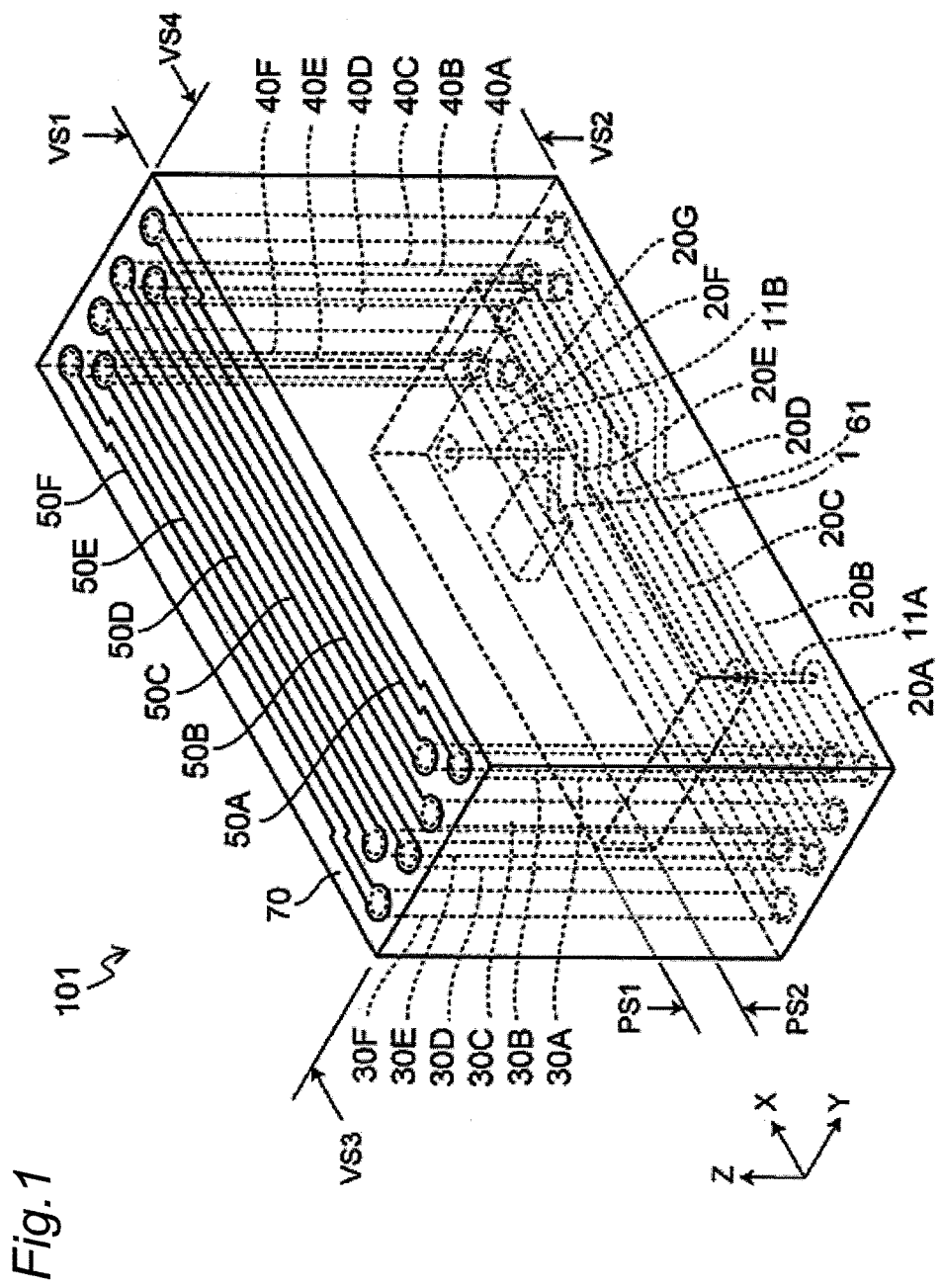
FIG. 1 is a perspective view of a wireless IC device of a first preferred embodiment according to the present invention.

A wireless IC device according to a preferred embodiment of the present invention may include an element body including a first principal surface and a second principal surface opposite to the first principal surface; an RFIC element buried in the element body and including a first input/output terminal and a second input/output terminal; and an antenna coil disposed in the element body and including one end connected to the first input/output terminal and the other end connected to the second input/output terminal, the antenna coil including a first wiring pattern provided on the second principal surface side of the element body and connected to the first input/output terminal and the second input/output terminal of the RFIC element, a first metal pin including a first end and a second end reaching the first principal surface and the second principal surface of the element body and connected at the first end to the first wiring pattern, a second metal pin including a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element including terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

With such a configuration, the terminal surfaces of the first input/output terminal and the second input/output terminal of the RFIC element face the second principal surface of the element body and, therefore, the terminal surfaces of the first input/output terminal and the second input/output terminal of the RFIC element hardly interfere with the magnetic field formation of the antenna coil. Since the terminal surfaces of the first input/output terminal and the second input/output terminal of the RFIC element are spaced away from the antenna coil, the RFIC element hardly interferes with the magnetic fluxes passing through the vicinity of the antenna coil. According to a wireless IC device of a preferred embodiment of the present invention, since the antenna coil includes portions having a comparatively large height dimension defined by metal pins, the electric characteristics are improved.

The RFIC element may be provided on a circuit substrate; the first conductor and the second conductor may include columnar metal pins; the first input/output terminal of the RFIC element may be connected to the first conductor through a connection terminal on the circuit substrate; and the second input/output terminal of the RFIC element may be connected to the second conductor through a connection terminal on the circuit substrate.

Such a configuration eliminates the need for routing complicated wirings on a multilayer substrate. By using metal pins, the first conductor and the second conductor are reduced in direct current resistance, and the electric characteristics are improved.

When viewed in a direction of a winding axis of the antenna coil, the circuit substrate may be disposed such that a surface including the first input/output terminal and the second input/output terminal of the RFIC element mounted thereon becomes closer to the winding axis than the second principal surface of the element body.

With such a configuration, the surface of the circuit substrate including the RFIC element mounted thereon is disposed closer to the winding axis of the antenna coil at a position hardly interfering with the magnetic field formation of the antenna coil. Therefore, the interference with the magnetic field formation of the antenna coil by the RFIC element is further reduced.

The circuit substrate may include a first surface facing the first principal surface of the element body and a second surface facing the second principal surface of the element body, and the RFIC element may be mounted on the second surface of the circuit substrate.

With such a configuration, a space can be provided between the circuit substrate and the antenna coil on the second surface side of the circuit substrate facing the second principal surface of the element body. Therefore, by mounting the RFIC element on the second surface of the circuit substrate, the height of the wireless IC device is smaller.

The circuit substrate may be equipped with a magnetic body defining and functioning as a magnetic body core of the antenna coil.

With such a configuration, the antenna coil having a predetermined inductance value is able to be acquired without increasing the size of the antenna coil. The magnetic field coupling to an antenna of a communication partner is enhanced by a magnetism collecting effect of the magnetic body core.

Each of the first and second wiring patterns may be one of a plurality of wiring patterns; each of the first and second metal pins may be one of a plurality of metal pins; and the antenna coil may have a helical shape including a plurality of loops including the first wiring patterns, the second wiring patterns, the first metal pins, and the second metal pins.

With such a configuration, the antenna coil having the large number of turns is able to be easily constructed without increasing the size of the wireless IC device.

Each of the first and second metal pins may be one of three or more metal pins, and the first metal pins and the second metal pins may separately be arranged in a Y-axis direction and may be disposed in a staggered manner when viewed in a Z-axis direction.

With such a configuration, even when the number of turns of the coil is increased, the wireless IC device is able to be reduced in thickness, i.e., the dimension in the Y-axis direction.

The antenna coil may include a plurality of loops different in inner/outer diameter when viewed in the Y-axis direction, and a loop located in an opening plane of the antenna coil may be a loop having a largest inner/outer diameter out of the plurality of loops.

Such a configuration increases an area of a coil opening allowing magnetic fluxes to enter and exit the helical-shaped antenna coil.

A resin molded body according to a preferred embodiment of the present invention may be a resin molded body including a wireless IC device including an element body including a first principal surface and a second principal surface opposite to the first principal surface, an RFIC element buried in the element body and including a first input/output terminal and a second input/output terminal, and an antenna coil disposed in the element body and including one end connected to the first input/output terminal and the other end connected to the second input/output terminal, the antenna coil including a first wiring pattern provided on the second principal surface side of the element body and connected to the first input/output terminal and the second input/output terminal of the RFIC element, a first metal pin including a first end and a second end reaching the first principal surface and the second principal surface of the element body and connected at the first end to the first wiring pattern, a second metal pin having a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element including terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

Such a configuration enables the provision of the resin molded body including a wireless IC device reducing the interference with the magnetic field of the antenna coil by the RFIC element and having excellent electric characteristics.

A communication terminal apparatus according to a preferred embodiment of the present invention may be a communication terminal apparatus including a wireless IC device including an element body including a first principal surface and a second principal surface opposite to the first principal surface, an RFIC element buried in the element body and including a first input/output terminal and a second input/output terminal, and an antenna coil disposed in the element body and including one end connected to the first input/output terminal and the other end connected to the second input/output terminal, the antenna coil including a first wiring pattern provided on the second principal surface side of the element body and connected to the first input/output terminal and the second input/output terminal of the RFIC, a first metal pin having a first end and a second end reaching the first principal surface and the second principal surface of the element body and connected at the first end to the first wiring pattern, a second metal pin having a third end and a fourth end reaching the first principal surface and the second principal surface of the element body and connected at the third end to the first wiring pattern, and a second wiring pattern provided on the first principal surface side of the element body and connected to the second end of the first metal pin and the fourth end of the second metal pin, the first input/output terminal and the second input/output terminal of the RFIC element having terminal surfaces disposed to face the second principal surface of the element body and spaced away from the antenna coil, the first input/output terminal of the RFIC element being connected to the first wiring pattern through a first conductor extending from the second principal surface of the element body in a direction of the first primary surface, the second input/output terminal of the RFIC element being connected to the first wiring pattern through a second conductor extending from the second principal surface of the element body in the direction of the first primary surface.

Such a configuration enables the provision of the communication terminal apparatus including a wireless IC device reducing the interference with the magnetic field of the antenna coil by the RFIC element and having excellent electric characteristics.

A method of manufacturing a wireless IC device according to a preferred embodiment of the present invention may include arranging a first conductor and a second conductor standing on an adhesive layer disposed on a pedestal, the first conductor being connected to a first input/output terminal of an RFIC element, the second conductor being connected to a second input/output terminal of the RFIC element; arranging on the adhesive layer a first metal pin including a first end and a second end as well as a second metal pin having a third end and a fourth end, the first metal pin and the second metal pin standing with the first end side and the third end side located on the adhesive layer side, coating with an element body the RFIC element, the first conductor, the second conductor, the first metal pin, and the second metal pin arranged on the adhesive layer; forming on a first principal surface side of the element body a second wiring pattern connecting the second end of the first metal pin and the fourth end of the second metal pin; removing the pedestal provided with the adhesive layer to form on a second principal surface side of the element body a first wiring pattern connecting the first end of the first metal pin and the third end of the second metal pin while connecting the first conductor and the first end of the first metal pin as well as connecting the second conductor and the third end of the second metal pin.

With such a configuration, the wireless IC device is able to be easily manufactured and reduces the interference with the magnetic field of the antenna coil by the RFIC element and has excellent electric characteristics. Since the metal pins are able to be strongly fixed by using the pedestal having the adhesive layer, the metal pins with a smaller diameter are able to be used in a portion of the antenna coil to manufacture the wireless IC device. Therefore, the wireless IC device is able to be manufactured to include a large number of windings of the antenna coil and include an antenna coil having a high inductance.

Preferred embodiments of the present invention will now be described with reference to the accompanying drawings. In the figures, elements are exaggeratingly shown so as to facilitate the description.

First Preferred Embodiment

Figure 2:
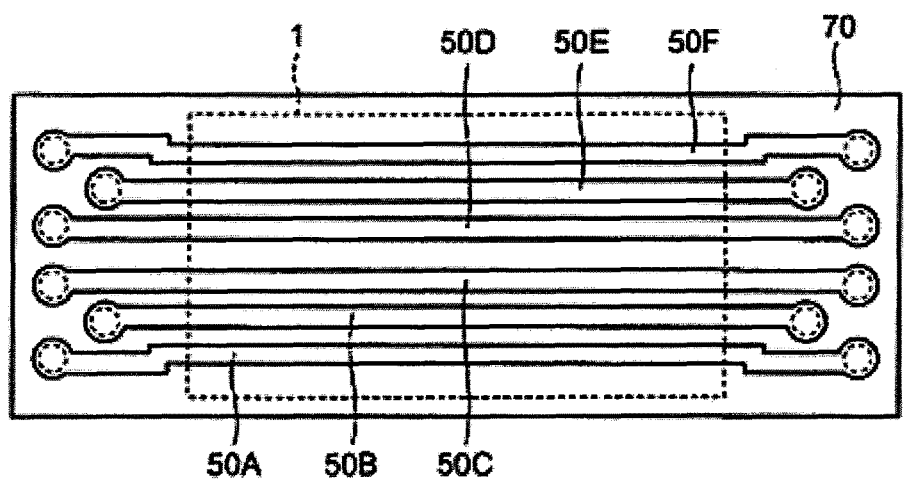
FIG. 2 is a plane view of the wireless IC device of the first preferred embodiment according to the present invention.
Figure 3:
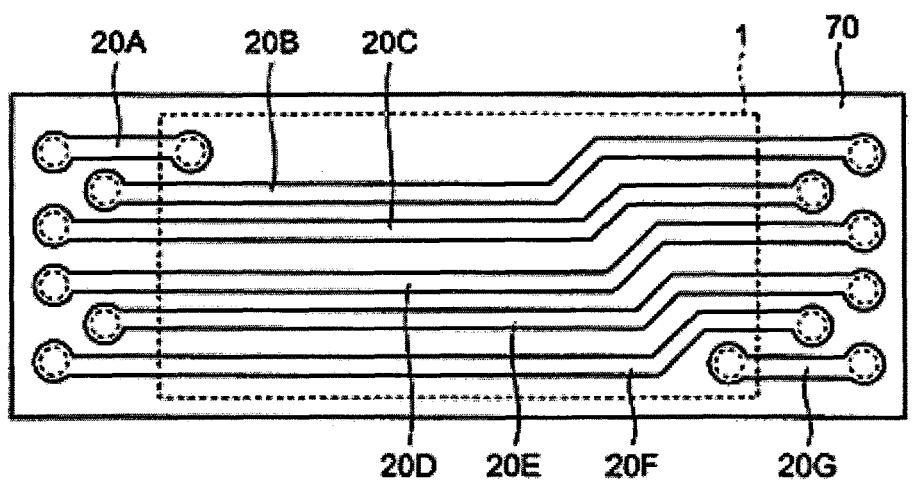
FIG. 3 is a bottom view of the wireless IC device of the first preferred embodiment according to the present invention.
Figure 4:
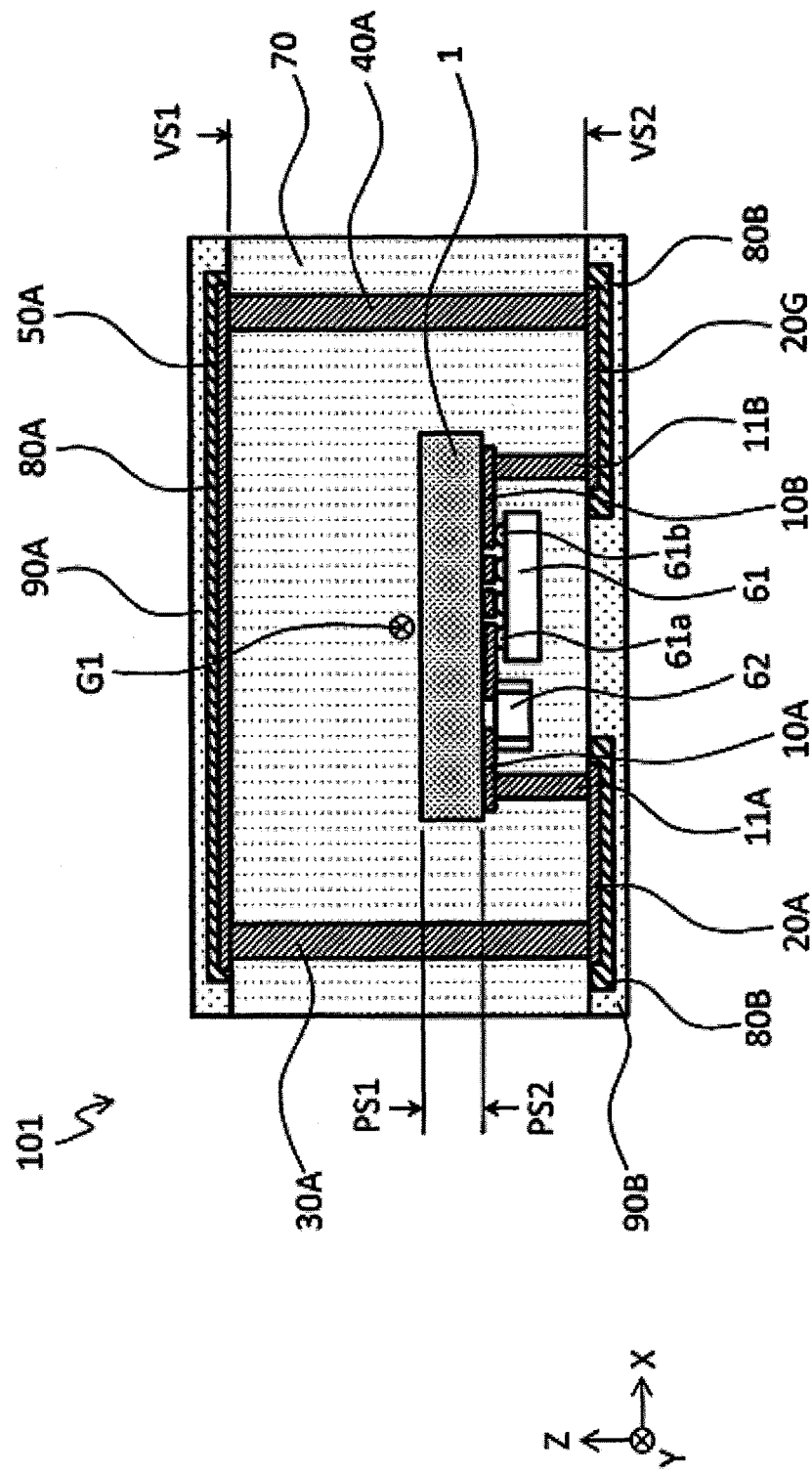
FIG. 4 is a schematic configuration diagram of the wireless IC device of the first preferred embodiment according to the present invention.

FIG. 1 is a perspective view of a wireless IC device 101 of a first preferred embodiment of the present invention. In an orthogonal X-Y-Z coordinate system of FIG. 1, an X-axis direction indicates a width direction of the wireless IC device 101, a Y-axis direction indicates a thickness direction of the wireless IC device 101, an a Z-axis direction indicates a height direction of the wireless IC device 101. FIG. 2 is a plane view of the wireless IC device 101. FIG. 3 is a bottom view of the wireless IC device 101. FIG. 4 is a schematic configuration diagram of the wireless IC device 101.

As shown in FIG. 1, the wireless IC device 101 includes an element body 70, a circuit substrate 1 buried in the element body 70, an RFIC element 61 mounted on the circuit substrate 1, and an antenna coil disposed on the element body 70. The antenna coil includes first wiring patterns 20A, 20B, 20C, 20D, 20E, 20F, 20G, first metal pins 30A, 30B, 30C, 30D, 30E, 30F, second wiring patterns 50A, 50B, 50C, 50D, 50E, 50F, and second metal pins 40A, 40B, 40C, 40D, 40E, 40F.

The element body 70 protects the circuit substrate 1, RFIC element 61, the antenna coil, etc. As shown in FIG. 1, the element body 70 preferably has a rectangular or substantially rectangular parallelepiped shape. Specifically, the element body includes a first principal surface VS1, a second principal surface VS2 opposite to the first principal surface VS1, a first side surface VS3 connected to the first principal surface VS1 and the second principal surface VS2, and a second side surface VS4 connected to the first principal surface VS1 and the second principal surface VS2. In the first preferred embodiment, the element body 70 is a resin member made of epoxy-based resin, for example.

As shown in FIG. 2, the second wiring patterns 50A, 50B, 50C, 50D, 50E, 50F extending in the X-axis direction are provided on the first principal surface VS1 of the element body 70. As shown in FIG. 3, the first wiring patterns 20A, 20B, 20C, 20D, 20E, 20F, 20G extending in the X-axis direction are provided on the second principal surface VS2 of the element body 70. As shown in FIG. 1, the first metal pins 30A, 30B, 30C, 30D, 30E, 30F extending in the Z-axis direction are buried in the vicinity of the first side surface VS3 of the element body 70. The second metal pins 40A, 40B, 40C, 40D, 40E, 40F extending in the Z-axis direction are buried in the vicinity of the second side surface VS4 of the element body 70.

Antenna Coil

The antenna coil preferably is a six-turn rectangular or substantially rectangular helical shape including the first wiring patterns 20A to 20G, the first metal pins 30A to 30F, the second wiring patterns 50A to 50F, and the second metal pins 40A to 40F.

As shown in FIG. 1, the first wiring patterns 20A to 20G extend in the X-axis direction on the second principal surface VS2 of the element body 70, and the second wiring patterns 50A to 50F extend in the X-axis direction on the first principal surface VS1 of the element body 70. The meaning of "extending in the X-axis direction" in this case is not limited to the meaning that the first wiring patterns 20A to 20G are parallel or substantially parallel to each other and that the second wiring patterns 50A to 50G are parallel or substantially parallel to each other. The meaning of "extending in the X-axis direction" in this case is not limited to the meaning that the first wiring patterns 20A to 20G and the second wiring patterns 50A to 50G are parallel or substantially parallel to each other. "Extending in the X-axis direction" also means that the directions of extension of the first wiring patterns 20A to 20G and the second wiring patterns 50A to 50G are generally directed in the X-axis direction, i.e., extended substantially in the X-axis direction.

The first metal pins 30A to 30F are arranged in the Y-axis direction in the vicinity of the first side surface VS3 of the element body 70 and extend in the Z-axis direction. The second metal pins 40A to 40F are arranged in the Y-axis direction in the vicinity of the second side surface VS4 of the element body 70 and extend in the Z-axis direction. In the first preferred embodiment, the first metal pins 30A to 30F and the second metal pins 40A to 40F are parallel or substantially parallel to each other.

Both the first metal pins 30A to 30F and the second metal pins 40A to 40F preferably are columnar pins made of Cu, for example. The first metal pins 30A to 30F and the second metal pins 40A to 40F preferably are acquired by cutting a Cu wire having a circular or substantially circular cross section by a predetermined length. The cross-sectional shape of the metal pins may not necessarily be circular or substantially circular. For example, the aspect ratio (height/bottom surface diameter) of the metal pins is preferably about 5 or more to about 30 or less.

As shown in FIG. 1, the first metal pins 30A to 30F extend in the normal direction to the second principal surface VS2 of the element body 70, i.e., in the Z-axis direction, and reach the first principal surface VS1 and the second principal surface VS2 of the element body 70. First ends of the first metal pins 30A to 30F are connected to the first wiring patterns 20A to 20F. Second ends of the first metal pins 30A to 30F are connected to the second wiring patterns 50A to 50F. The first ends mean end portions on the one end side on the second principal surface VS2 side of the element body 70 among the longitudinal end portions of the first metal pins 30A to 30F, and the second ends mean end portions on the other end side on the first principal surface VS1 side of the element body 70 among the longitudinal end portions of the first metal pins 30A to 30F.

More specifically, the first end of the first metal pin 30A is connected to the first wiring pattern 20A. The first end of the first metal pin 30B is connected to the first wiring pattern 20B. The first end of the first metal pin 30C is connected to the first wiring pattern 20C. The first end of the first metal pin 30D is connected to the first wiring pattern 20D. The first end of the first metal pin 30E is connected to the first wiring pattern 20E. The first end of the first metal pin 30F is connected to the first wiring pattern 20F.

The second end of the first metal pin 30A is connected to the second wiring pattern 50A. The second end of the first metal pin 30B is connected to the second wiring pattern 50B. The second end of the first metal pin 30C is connected to the second wiring pattern 50C. The second end of the first metal pin 30D is connected to the second wiring pattern 50D. The second end of the first metal pin 30E is connected to the second wiring pattern 50E. The second end of the first metal pin 30F is connected to the second wiring pattern 50F.

As shown in FIG. 1, the second metal pins 40A to 40F are arranged to extend in the normal direction to the second principal surface VS2 of the element body 70, i.e., in the Z-axis direction, and reach the first principal surface VS1 and the second principal surface VS2 of the element body 70. Third ends of the second metal pins 40A to 40F are connected to the first wiring patterns 20B to 20G. Fourth ends of the second metal pins 40A to 40F are connected to the second wiring patterns 50A to 50F. The third ends mean end portions on the one end side on the second principal surface VS2 side of the element body 70 among the longitudinal end portions of the second metal pins 40A to 40F, and the fourth ends mean end portions on the other end side on the first principal surface VS1 side of the element body 70 among the longitudinal end portions of the second metal pins 40A to 40F.

More specifically, the third end of the second metal pin 40A is connected to the first wiring pattern 20B. The third end of the second metal pin 40B is connected to the first wiring pattern 20C. The third end of the second metal pin 40C is connected to the first wiring pattern 20D. The third end of the second metal pin 40D is connected to the first wiring pattern 20E. The third end of the second metal pin 40E is connected to the first wiring pattern 20F. The third end of the second metal pin 40F is connected to the first wiring pattern 20G.

The fourth end of the second metal pin 40A is connected to the second wiring pattern 50A. The fourth end of the second metal pin 40B is connected to the second wiring pattern 50B. The fourth end of the second metal pin 40C is connected to the second wiring pattern 50C. The fourth end of the second metal pin 40D is connected to the second wiring pattern 50D. The fourth end of the second metal pin 40E is connected to the second wiring pattern 50E. The fourth end of the second metal pin 40F is connected to the second wiring pattern 50F.

As described above, the antenna coil includes a plurality of loops in accordance with the numbers of the first wiring patterns 20A to 20G including a plurality of wiring patterns, the second wiring patterns 50A to 50F including a plurality of wiring patterns, the first metal pins 30A to 30F including a plurality of metal pins, and the second metal pins 40A to 40F including a plurality of metal pins.

The circuit substrate 1 is a flat plate-shaped printed wiring board including a first surface PS1 and a second surface PS2 and is buried in the element body 70. As shown in FIG. 4, the first surface PS1 of the circuit substrate 1 is disposed to face the first principal surface VS1 side of the element body 70, and the second surface PS2 is disposed to face the second principal surface VS2 side of the element body.

As shown in FIG. 4, on the second surface PS2 of the circuit substrate 1, wiring conductor patterns 10A, 10B are provided, and an RFIC element 61 and a chip capacitor 62 etc. are mounted. The second surface PS2 is a mounting surface for the RFIC element 61 and tends to interfere with the magnetic field of the antenna coil. Therefore, the second surface PS2 of the circuit substrate 1 is disposed to face the second principal surface VS2 of the element body 70. In other words, terminal surfaces of a first input/output terminal 61a and a second input/output terminal 61b of the RFIC element 61 are disposed to face the second principal surface VS2 of the element body 70.

The second surface PS2 of the circuit substrate 1 is preferably disposed in parallel or substantially in parallel with a direction of a winding axis G1 of the antenna coil, i.e., the Y-axis direction, so as not to intersect with the winding axis G1 of the antenna coil. More preferably, the second surface PS2 of the circuit substrate 1 is disposed to be parallel or substantially parallel to the second principal surface VS2 of the element body 70.

The magnetic field generated by the antenna coil becomes stronger at a position closer to the antenna coil. Therefore, in the wireless IC device 101, the circuit substrate 1 including the RFIC element 61 mounted thereon is spaced away from the antenna coil. When the circuit substrate 1 is viewed in the winding axis G1 direction of the antenna coil, i.e., the Y-axis direction, the second surface PS2 including the RFIC element 61 mounted thereon is preferably located closer to the winding axis G1 than the second principal surface VS2 of the element body 70. More preferably, to reduce the effect on the magnetic field formation of the antenna coil and the thermal effect due to high-temperature resin at the time of injection molding if the wireless IC device 101 is built into a resin molded body, for example, the second surface PS2 including the RFIC element 61 mounted thereon is preferably located at the center of the wireless IC device 101.

The circuit substrate 1 is provided with a first conductor 11A and a second conductor 11B so as to electrically connect the RFIC element 61 mounted on the second surface PS2 and the first wiring patterns 20A, 20G. The first conductor 11A and the second conductor 11B extend from the second surface PS2 of the circuit substrate 1 toward the second principal surface VS2 of the element body 70. In other words, the conductors extend from the second principal surface VS2 of the element body 70 in the direction of the first principal surface VS1, i.e., the Z-axis direction.

More specifically, the first conductor 11A connects the first wiring pattern 20A provided on the second principal surface VS2 of the element body 70 and the wiring conductor pattern 10A provided on the second surface PS2 of the circuit substrate 1. The second conductor 11B connects the first wiring pattern 20G provided on the second principal surface VS2 of the element body 70 and the wiring conductor pattern 10B provided on the second surface PS2 of the circuit substrate 1.

Figure 5:
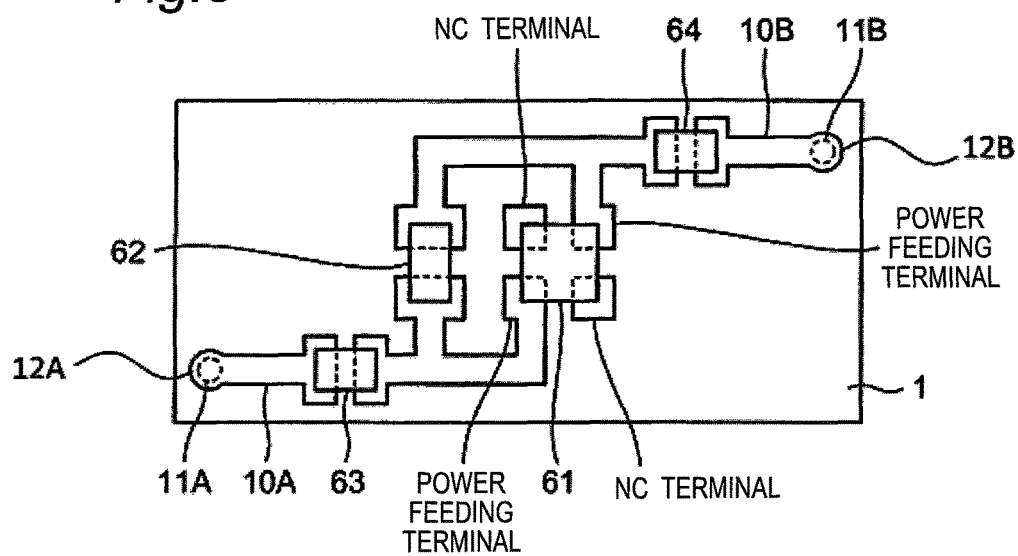
FIG. 5 is a plane view of a circuit substrate in the first preferred embodiment according to the present invention.

FIG. 5 is a bottom view of the circuit substrate 1, showing the second surface PS2 of the circuit substrate 1. As shown in FIG. 5, the wiring conductor patterns 10A, 10B and NC terminals are provided on the second surface PS2 of the circuit substrate 1. For example, the wiring conductor patterns 10A, 10B and the NC terminals are patterned by etching of Cu foil etc. The wiring conductor patterns 10A, 10B are provided with power feeding terminals connected to the first input/output terminal 61a and the second input/output terminal 61b of the RFIC element 61. The wiring conductor patterns 10A, 10B are provided with lands to mount the chip capacitors 62, 63, 64. The wiring conductor patterns 10A, 10B are provided with connection terminals 12A, 12B connecting the first conductor 11A and the second conductor 11B.

The wiring conductor patterns 10A, 10B are respectively electrically connected to one end and the other end of the antenna coil through the first conductor 11A and the second conductor 11B extending from the second principal surface VS2 of the element body 70 in the direction of the first principal surface VS1. The first wiring pattern 20A of the antenna coil is connected in series to the wiring conductor pattern 10A, while the first wiring pattern 20G is connected in series to the wiring conductor pattern 10B.

More specifically, one end of the first conductor 11A is connected to the first wiring pattern 20A provided on the second principal surface VS2 of the element body 70, and the other end of the first conductor 11A is connected to the connection terminal 12A disposed on the circuit substrate 1. One end of the second conductor 11B is connected to the first wiring pattern 20G provided on the second principal surface VS2 of the element body 70, and the other end of the second conductor 11B is connected to the connection terminal 12B disposed on the circuit substrate 1.

The first conductor 11A and the second conductor 11B preferably are columnar metal pins, for example. The first conductor 11A and the second conductor 11B have a longitudinal length, i.e., a length in the Z-direction, longer than the thickness of surface mounted components such as the RFIC element 61 and the chip capacitor 62 etc. The first conductor 11A and the second conductor 11B may be made of a material having electric conductivity and may be made of a metal material such as Cu, for example.

The RFIC element 61 preferably is acquired by packaging an RFIC chip (bare chip) having the first input/output terminal 61a and the second input/output terminal 61b. The RFIC element 61 is mounted on the second surface PS2 side of the circuit substrate 1. More specifically, as shown in FIGS. 4 and 5, the first input/output terminal 61a of the RFIC element 61 is connected to the power feeding terminal of the wiring conductor pattern 10A provided on the second surface PS2 side of the circuit substrate 1. The second input/output terminal 61b is connected to the power feeding terminal of the wiring conductor pattern 10B provided on the second surface PS2 side of the circuit substrate 1. The RFIC element 61 is also connected to the NC terminal provided on the second surface PS2 side of the circuit substrate 1.

Figure 6:
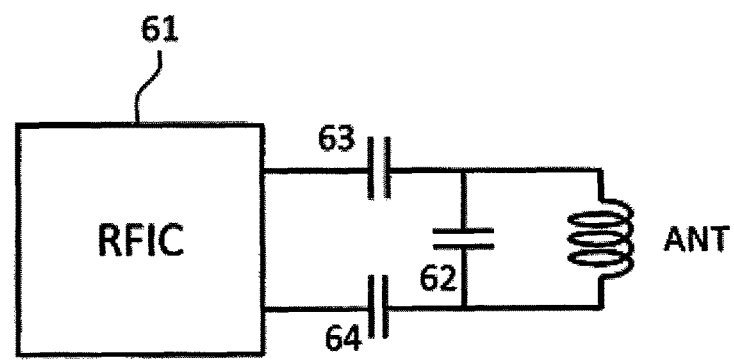
FIG. 6 is a circuit diagram of the wireless IC device of the first preferred embodiment according to the present invention.

FIG. 6 is a circuit diagram of the wireless IC device 101. The antenna coil ANT described above is connected to the RFIC element 61. To the antenna coil ANT, the chip capacitor 62 is connected in parallel or substantially parallel and the chip capacitors 63, 64 are connected in series. An LC resonance circuit includes the antenna coil ANT, the chip capacitors 62, 63, 64, and a capacitance component of the RFIC element 61 itself. The chip capacitors 62, 63, 64 define a matching circuit that adjusts a frequency. The capacitances of the capacitors 62, 63, 64 are selected such that the resonance frequency of the LC resonance circuit preferably is set to a frequency equal or substantially equal to a communication frequency of an RFID system, for example, 13.56 MHz.

As shown in FIG. 4, the wireless IC device 101 includes plating layers 80A and 80B disposed on the first wiring patterns 20A to 20G and the second wiring patterns 50A to 50F. The plating layers 80A and 80B preferably include plating films made of Cu, etc. The plating layers 80A and 80B increase the film thickness of the first wiring patterns 20A to 20G and the second wiring patterns 50A to 50F to reduce a direct current resistance component of the coil. The wireless IC device 101 also includes protective layers 90A and 90B for preventing oxidation disposed on the plating layers 80A and 80B. The protective layers 90A and 90B include protective resin films such as solder resist films, for example. It is noted that the plating layers 80A and 80B and the protective layers 90A and 90B are not shown in FIGS. 1 to 3 for simplification of description.

The "RFID element" may be an RFIC chip itself or an RFIC package including a matching circuit etc. integrated with the RFIC chip. The "RFID tag" includes an RFIC element and an antenna coil connected to the RFIC element and is defined as an information medium reading and writing data of a built-in memory without contact by using radio waves, i.e., electromagnetic waves, or a magnetic field. Therefore, the wireless IC device of this preferred embodiment preferably is an RFID tag.

The RFIC element 61 includes, for example, an HF-band high-frequency wireless IC chip for an HF-band RFID system. The wireless IC device 101 preferably is disposed on an article to be managed, for example. By bringing the wireless IC device 101, i.e., the RFID tag, attached to the article closer to a reader/writer apparatus, magnetic field coupling is achieved between the antenna coil of the wireless IC device 101 and an antenna coil of the reader/writer apparatus of RFID. As a result, RFID communication is performed between the RFID tag and the reader/writer apparatus.

Arrangement of the first metal pins 30A to 30F and the second metal pins 40A to 40F in the wireless IC device 101 according to the first preferred embodiment will be described with reference to FIGS. 7 and 8.

Figure 7:
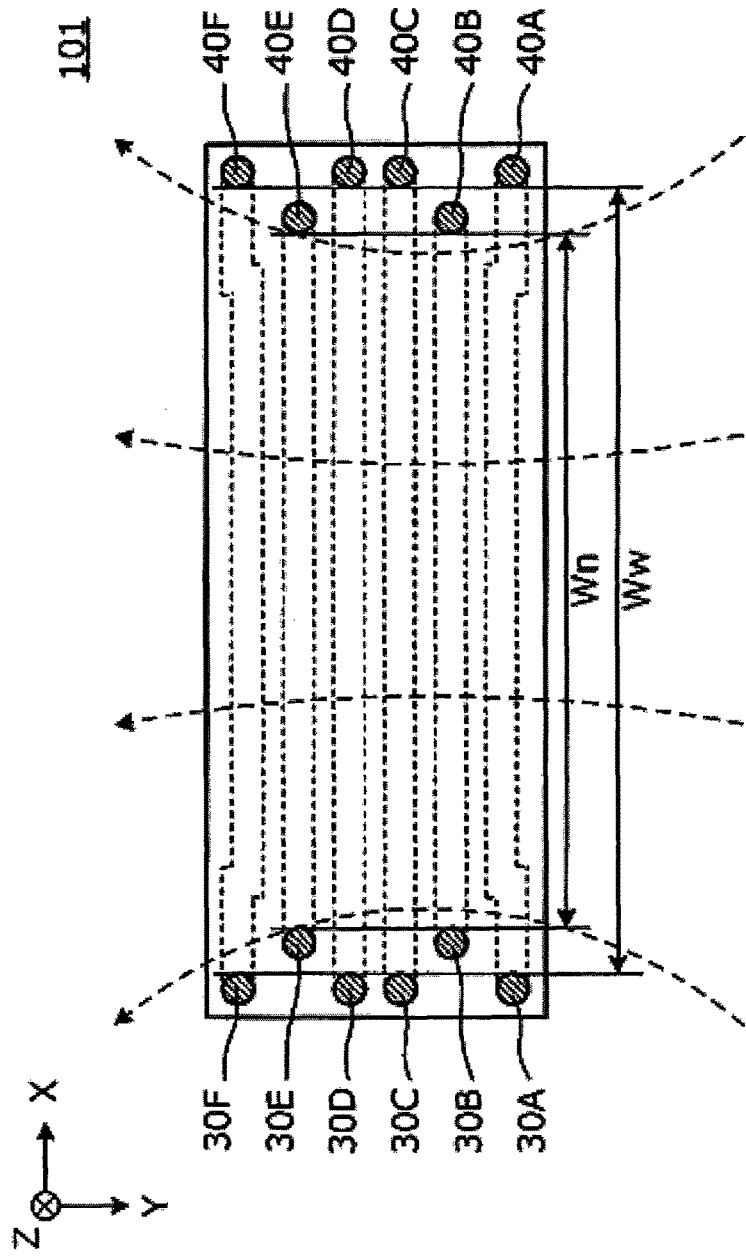
FIG. 7 is a transverse cross-sectional view of a wireless IC device of Example 1.

FIG. 7 is a transverse cross-sectional view of a wireless IC device of Example 1. FIG. 8 is a transverse cross-sectional view of a wireless IC device of Example 2. The wireless IC device of Example 1 and the wireless IC device of Example 2 are different in arrangement of the first metal pins 30A to 30F and the second metal pins 40A to 40F.

In both Example 1 and Example 2, a plurality of the first metal pins 30A to 30F and a plurality of the second metal pins 40A to 40F are separately arranged in the Y-axis direction and are arranged in a staggered manner (in zigzag alignment) when viewed in the Z-axis direction. As shown in FIG. 7, in Example 1, a rectangular or substantially rectangular helical-shaped antenna coil includes two types of loops different in coil inner/outer diameter. A loop including the first metal pin 30A and the second metal pin 40A, a loop including the first metal pin 30C and the second metal pin 40C, a loop including the first metal pin 30D and the second metal pin 40D, and a loop including the first metal pin 30F and the second metal pin 40F have respective opening widths of Ww. A loop including the first metal pin 30B and the second metal pin 40B and a loop including the first metal pin 30E and the second metal pin 40E have respective opening widths of Wn. Wn<Ww is satisfied. On the other hand, in Example 2, all the loops have the same opening widths of W as shown in FIG. 8.

In Example 1, the loops at two opening plane positions of the rectangular or substantially rectangular helical-shaped antenna coil, i.e., the loop including the first metal pin 30A and the second metal pin 40A and the loop including the first metal pin 30F and the second metal pin 40F, have the inner/outer diameter of the larger loops between the two types of loops.

In other words, it is assumed that a "first loop" refers to the loop including the first metal pin 30A at the first end position in the Y-axis direction out of the plurality of the first metal pins 30A to 30F and the second metal pin 40A at the third end position in the Y-axis direction out of the plurality of the second metal pins 40A to 40F. It is also assumed that a "second loop" refers to the loop including the first metal pin 30F at the second end position in the Y-axis direction out of the plurality of the first metal pins 30A to 30F and the second metal pin 40F at the fourth end position in the Y-axis direction out of the plurality of the second metal pins 40A to 40F. In this case, the inner/outer diameter of the first loop and the second loop is that of the loops having the larger inner/outer diameter between the two types of loops.

Figure 8:
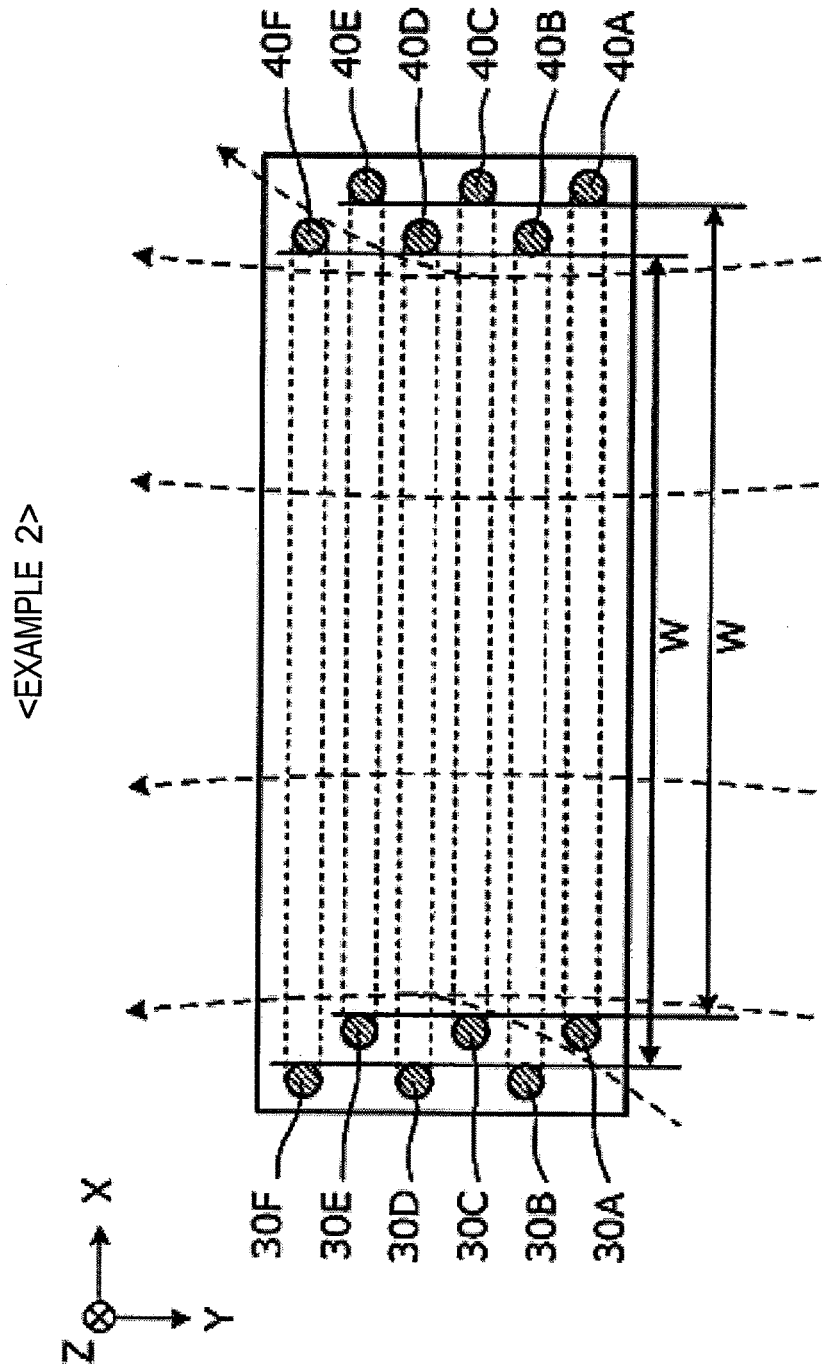
FIG. 8 is a transverse cross-sectional view of a wireless IC device of Example 2.

In FIGS. 7 and 8, broken lines correspond to a conceptual diagram of magnetic fluxes when the magnetic fluxes enter and exit the rectangular or substantially rectangular helical-shaped antenna coil. In Example 2 shown in FIG. 8, the substantial inner/outer diameter of the loops at the two opening plane positions of the rectangular or substantially rectangular helical-shaped antenna coil is smaller than the opening width W of the loops. The magnetic fluxes easily leak from gaps between the adjacent metal pins. On the other hand, in Example 1 shown in FIG. 7, since the inner/outer diameter of the loops at the two opening plane positions of the rectangular or substantially rectangular helical-shaped antenna coil is that of the loops having the larger inner/outer diameter between the two types of loops, the coil opening allowing the magnetic fluxes to enter and exit the antenna coil is larger as compared to Example 2. The magnetic fluxes hardly leak from gaps between the adjacent metal pins. Therefore, the antenna coil achieves the magnetic field coupling to the antenna of the communication partner in a relatively broad positional relationship. Thus, if a helical-shaped antenna coil having the number of turns equal to or greater than three, preferably, the metal pins are arranged such that a loop area becomes larger on the both end sides in the direction of the Y-axis that is the coil axis.

The rectangular or substantially rectangular helical-shaped antenna coil may include three or more types of loops different in inner/outer diameter. Even in such a case, the inner/outer diameter of the loops at the two opening plane positions of the antenna coil may be that of the loops having the largest inner/outer diameter among the multiple types of loops.

A method of manufacturing the wireless IC device 101 according to the first preferred embodiment will be described with reference to FIGS. 9A to 9H. FIGS. 9A to 9H show manufacturing steps of the wireless IC device 101 in order.

Figure 9A:
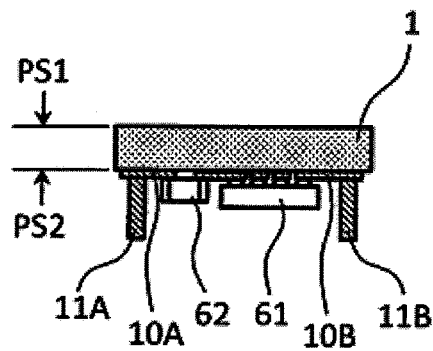
FIG. 9A is a diagram of manufacturing steps of the wireless IC device of the first preferred embodiment according to the present invention.

As shown in FIG. 9A, the circuit substrate 1 is prepared. Specifically, the wiring conductor patterns 10A, 10B are provided on the second surface PS2 of the circuit substrate 1. Additionally, the power feeding terminals and the NC terminals to mount the RFIC element etc., the lands to mount the chip capacitors 62, 63, 64, and the connection terminals 12A, 12B for connecting the first conductor 11A and the second conductor 11B are provided on the second surface PS2 of the circuit substrate 1. Routing patterns etc. to connect the power feeding terminals, the lands, and the connection terminals 12A, 12B described above are also provided on the second surface PS2 of the circuit substrate 1 (see FIG. 5).

Subsequently, the RFIC element 61, the chip capacitors 62, 63, 64, the first conductor 11A, and the second conductor 11B are each mounted through a conductive bonding material such as solder on the wiring conductor patterns 10A, 10B of the circuit substrate 1. If solder is used, after printing a solder paste and mounting the components by a mounter on the wiring conductor patterns 10A, 10B of the second surface PS2 of the circuit substrate 1, these components are soldered by a reflow process. As a result, the RFIC element 61, the chip capacitors 62, 63, 64, the first conductor 11A, and the second conductor 11B are made electrically conductive with, and bonded structurally to, the circuit substrate 1.

The circuit substrate 1 is, for example, a printed wiring board such as a glass epoxy substrate or a resin substrate, and the wiring conductor patterns 10A, 10B, the lands, and the connection terminals 12A, 12B are acquired by patterning of a copper foil. The circuit substrate 1 may be a ceramic substrate including a thick-film pattern formed thereon.

For example, the cross-sectional dimensions of the wiring conductor patterns 10A, 10B are approximately 18 μm×10 μm. After the patterning, plating of Cu etc. is preferably applied to increase a total film thickness to about 40 μm to about 50 μm, for example.

The RFIC element 61 is acquired by packaging an RFIC chip for an RFID tag. The chip capacitors 62, 63, 64 are laminated ceramic chip components.

Figure 9B:
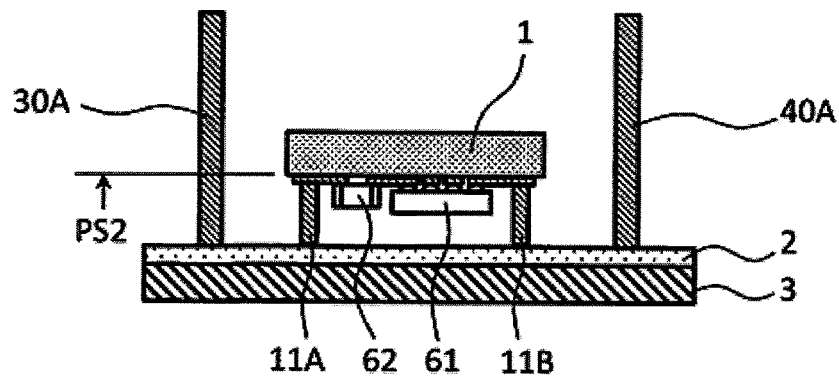
FIG. 9B is a diagram of the manufacturing steps of the wireless IC device of the first preferred embodiment according to the present invention.

As shown in FIG. 9B, the circuit substrate 1, the first metal pins 30A to 30F, and the second metal pins 40A to 40F are each disposed on an adhesive layer 2 of a pedestal 3 including the adhesive layer 2. The circuit substrate 1 is disposed on the pedestal 3 with the second surface PS2 directed toward the adhesive layer 2 such that the first conductor 11A and the second conductor 11B stand on the adhesive layer 2. The first metal pins 30A to 30F and the second metal pins 40A to 40F are mounted with the first ends and the third ends, respectively, directed toward the adhesive layer 2 such that the pins stand on the pedestal 3. The circuit substrate 1, the first metal pins 30A to 30F, and the second metal pins 40A to 40F are disposed on the pedestal 3 in this way in a strongly fixed state. For stable fixation to the pedestal 3, the circuit substrate 1 may be fixed to the adhesive layer 2 by a supporting member made of the same material as the element body 70, for example.

The adhesive layer 2 is made of a resin having adhesiveness, for example. The first metal pins 30A to 30F and the second metal pins 40A to 40F are respective metal pins made of Cu. These metal pins preferably have a columnar shape of about 0.3 mm in diameter and about 7 mm in length, for example. Although not limited to those composed mainly of Cu, the metal pins are preferably mainly composed of Cu in terms of conductivity and workability.

Figure 9C:
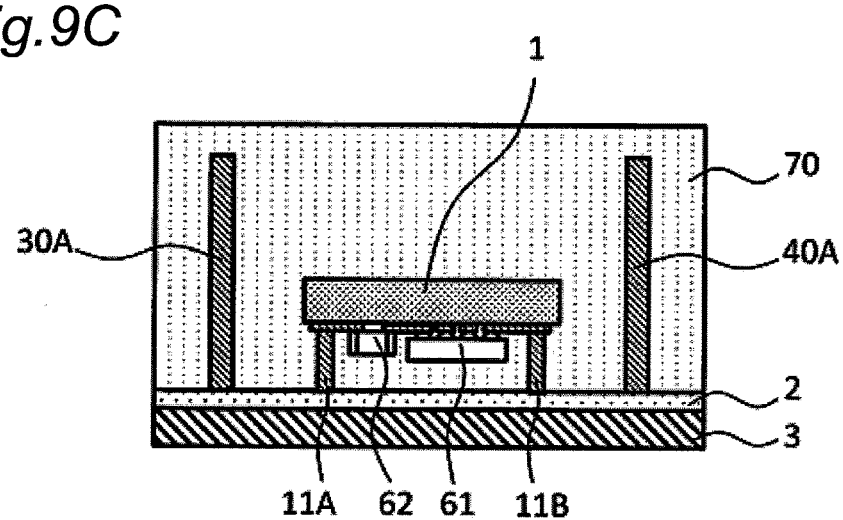
FIG. 9C is a diagram of the manufacturing steps of the wireless IC device of the first preferred embodiment according to the present invention.

As shown in FIG. 9C, the element body 70 is formed to the height of the first metal pins 30A to 30F and the second metal pins 40A to 40F. Specifically, an epoxy resin etc. are applied to a predetermined height. The predetermined height is equal to or greater than at least the height of the first metal pins 30A to 30F and the second metal pins 40A to 40F. As a result, the first metal pins 30A to 30F and the second metal pins 40A to 40F are coated with the element body 70.

Figure 9D:
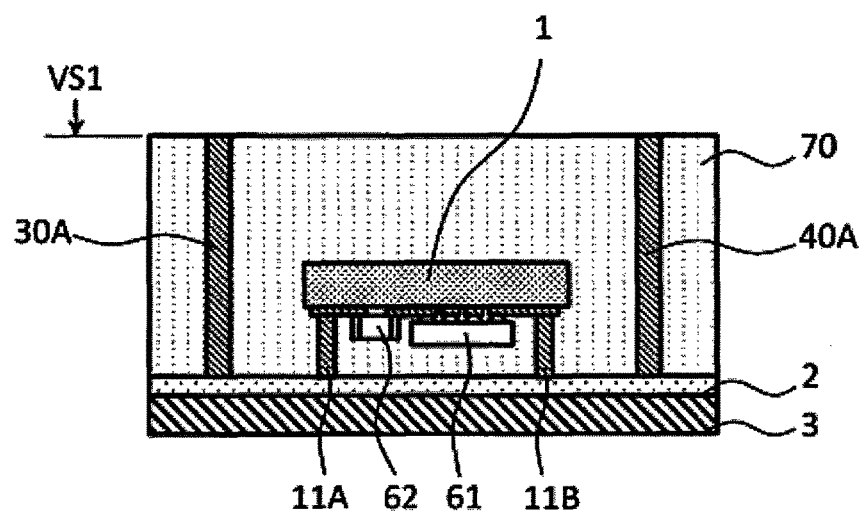
FIG. 9D is a diagram of the manufacturing steps of the wireless IC device of the first preferred embodiment according to the present invention.

As shown in FIG. 9D, the first principal surface VS1 of the element body 70 is ground in a planar manner to expose the second ends of the first metal pins 30A to 30F and the fourth ends of the second metal pins 40A to 40F.

The element body 70 may be disposed by applying a liquid resin or may be disposed by laminating semi-cured sheet-shaped resins.

Figure 9E:
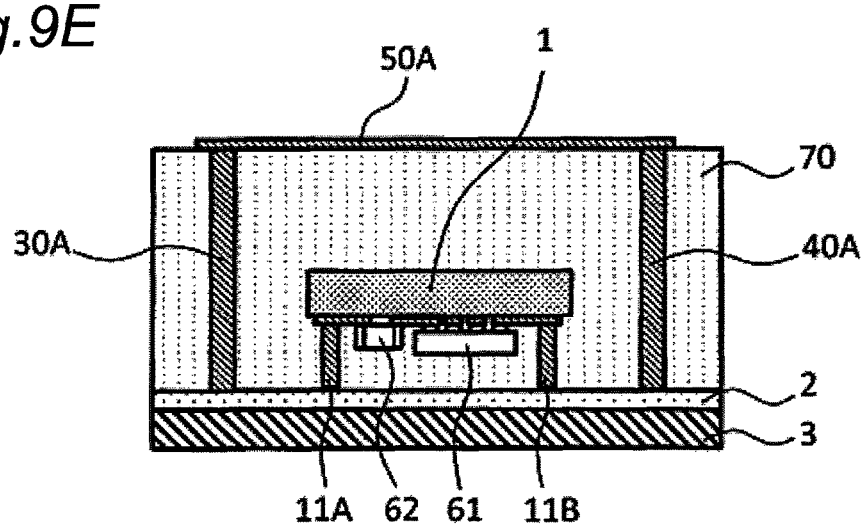
FIG. 9E is a diagram of the manufacturing steps of the wireless IC device of the first preferred embodiment according to the present invention.

As shown in FIG. 9E, the second wiring patterns 50A to 50F are provided on the first principal surface VS1 of the element body 70 with the second ends of the first metal pins 30A to 30F and the fourth ends of the second metal pins 40A to 40F exposed (see FIG. 3). Specifically, a conductive paste is screen-printed on the first principal surface VS1 of the element body 70 to form the second wiring patterns 50A to 50F. As a result, the second wiring patterns 50A to 50F are connected to the second ends of the first metal pins 30A to 30F and the fourth ends of the second metal pins 40A to 40F.

Figure 9F:
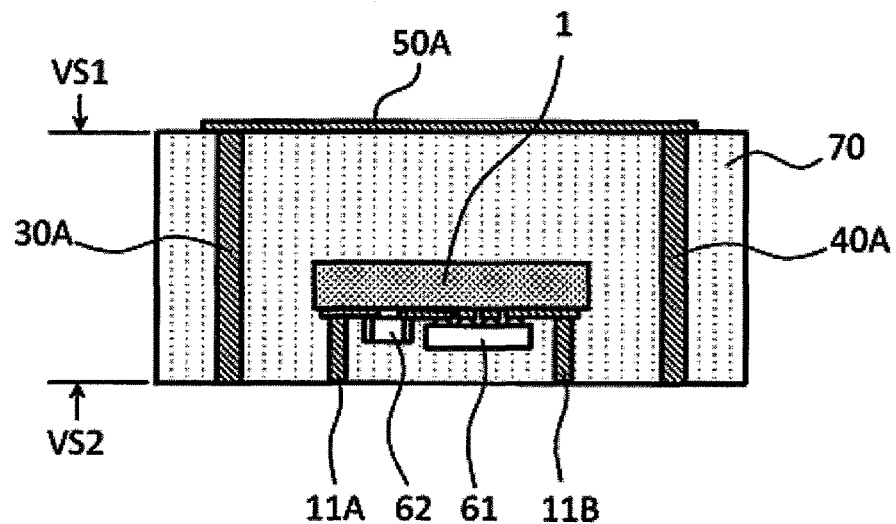
FIG. 9F is a diagram of the manufacturing steps of the wireless IC device of the first preferred embodiment according to the present invention.

As shown in FIG. 9F, the pedestal 3 having the adhesive layer 2 is removed from the element body 70 to expose the first ends of the first metal pins 30A to 30F, the third ends of the second metal pins 40A to 40F, and one ends of the first conductor 11A and the second conductor 11B on the second principal surface VS2 of the element body 70. Specifically, the pedestal 3 is removed from the element body 70, and the adhesive layer 2 and the element body 70 are ground in a planar manner to expose the first ends of the first metal pins 30A to 30F, the third ends of the second metal pins 40A to 40F, and the one ends of the first conductor 11A and the second conductor 11B on the second principal surface VS2 of the element body 70.

Figure 9G:
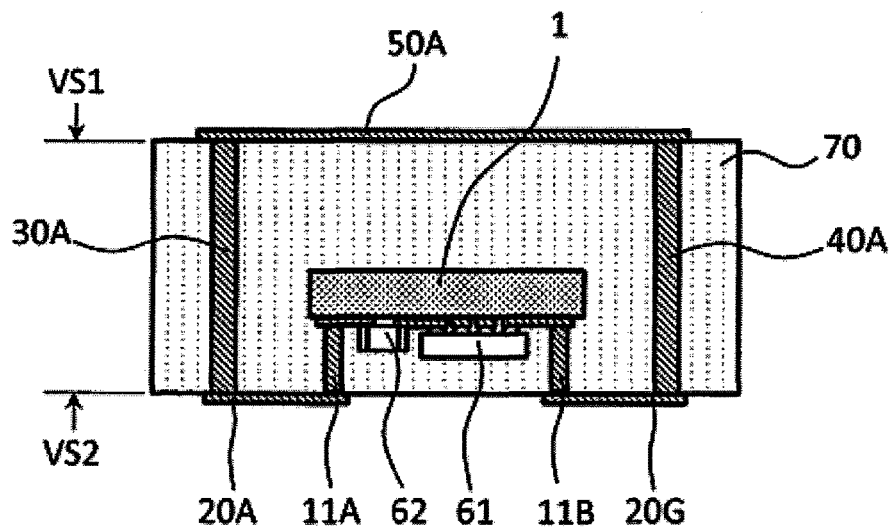
FIG. 9G is a diagram of the manufacturing steps of the wireless IC device of the first preferred embodiment according to the present invention.

As shown in FIG. 9G, the first wiring patterns 20A to 20G are provided on the second principal surface VS2 of the element body 70 with the first ends of the first metal pins 30A to 30F, the third ends of the second metal pins 40A to 40F, the one ends of the first conductor 11A and the second conductor 11B exposed (see FIG. 2). Specifically, a conductive paste is screen-printed on the second principal surface VS2 of the element body 70 to form the first wiring patterns 20A to 20G. As a result, the first wiring patterns 20A to 20G are connected to the first ends of the first metal pins 30A to 30F and the third ends of the second metal pins 40A to 40F. The first wiring patterns 20A to 20G are connected also to the one ends of the first conductor 11A and the second conductor 11B, respectively.

The first wiring patterns 20A to 20G and the second wiring patterns 50A to 50F may be formed by forming conductive films such as Cu films by a plating method on the second principal surface VS2 and the first principal surface VS1, respectively, of the element body 70 and patterning the conductive films by photoresist film formation and etching.

Figure 9H:
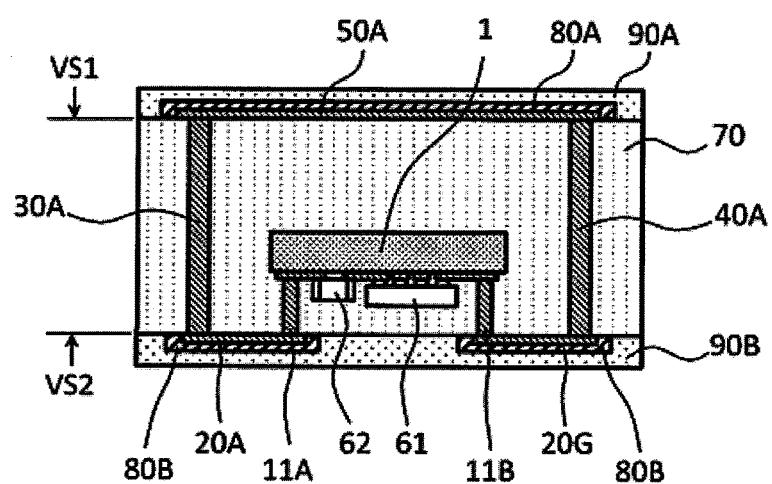
FIG. 9H is a diagram of the manufacturing steps of the wireless IC device of the first preferred embodiment according to the present invention.

As shown in FIG. 9H, the plating layers 80A, 80B are provided on the first wiring patterns 20A to 20G and the second wiring patterns 50A to 50F. The protective layers 90A, 90B are formed over the plating layers 80A, 80B on the formation surfaces of the first wiring patterns 20A to 20G and the second wiring patterns 50A to 50F.

The plating layers are formed of plating films of Cu etc. In the case of the Cu plating films, Au plating films may further be provided on surfaces of the plating films of Cu etc. By forming the plating films, the first wiring patterns 20A to 20G and the second wiring patterns 50A to 50F are increased in film thickness, and the direct current resistance (DCR) thereof can be made smaller to reduce a conductor loss. In this way, the DCR of the first wiring patterns 20A to 20G and the second wiring patterns 50A to 50F can be made smaller to a level equivalent to the DCR of the first metal pins 30A to 30F and the second metal pins 40A to 40F. In particular, the element body in this stage has the first wiring patterns 20A to 20G and the second wiring patterns 50A to 50F exposed on the outer surface. Therefore, this element body can be immersed into a plating liquid to selectively increase the thickness of the first wiring patterns 20A to 20G and the second wiring patterns 50A to 50F. For example, in the wireless IC device 101, the thickness of the first wiring patterns 20A to 20G is increased as compared to the thickness of the wiring conductor patterns 10A, 10B.

The protective layers 90A, 90B are protective resin films that prevent oxidation and are solder resist films, for example.

The above steps are executed directly in a state of a mother substrate. Lastly, the mother substrate is separated into individual wireless IC device units (pieces).

The wireless IC device 101 according to the first preferred embodiment achieves the following advantageous effects.

In the wireless IC device 101 according to the first preferred embodiment, the terminal surfaces of the first input/output terminal 61a and the second input/output terminal 61b of the RFIC element 61 are disposed to face the second principal surface VS2 of the element body 70. Therefore, the terminal surfaces of the first input/output terminal 61a and the second input/output terminal 61b of the RFIC element 61 do not intersect with the winding axis G1 of the antenna coil. As a result, the RFIC element 61 hardly interferes with the magnetic field formation of the antenna coil.

The terminal surfaces of the first input/output terminal 61a and the second input/output terminal 61b of the RFIC element 61 are spaced away from the antenna coil. Consequently, the RFIC element 61 hardly interferes with the magnetic fluxes passing through the vicinity of the antenna coil. Particularly, when viewed in the winding axis G1 direction of the antenna coil, the terminal surfaces of the RFIC element 61 are disposed closer to the winding axis G1 than the second principal surface VS2 of the element body and, therefore, the interference with the magnetic field formation of the antenna coil by the RFIC element 61 is further reduced.

Therefore, the wireless IC device 101 reduces the interference with the magnetic field by the RFIC element 61. For example, the wireless IC device 101 significantly decreases or prevents a reduction in reception sensitivity of the antenna coil due to the RFIC element 61, or a transmission signal going around to a reception circuit etc. The wireless IC device 101 also significantly decreases or prevents the interference with the operation of the RFIC element 61 by the antenna coil. For example, malfunction, unstable operation, etc. of the RFIC element 61 is significantly reduced or prevented.

According to the wireless IC device 101, since a portion of the antenna coil is defined by metal pins in terms of a portion having a comparatively large height dimension, connecting locations are able to be reduced as compared to when a plurality of base material layers including interlayer connection conductors is laminated to form connection portions in the height direction, for example. Therefore, the wireless IC device 101 improves the electric characteristics of the antenna coil. If a plurality of base material layers including via-hole type interlayer connection conductors is laminated to define the connection portions, a through-hole is formed in a substrate and this through-hole is filled with a conductive paste etc., to form an interlayer connection conductor, i.e., a via. In this case, the through-hole includes a tapered portion formed at the time of processing and, therefore, if a plurality of the base material layers is laminated, vias different in diameter are laminated. Additionally, when a plurality of the base material layers is laminated, a different kind of material such as copper may be interposed between vias.

Since the wireless IC device 101 eliminates the need for forming a coil in a multilayer substrate and the need for routing complicated wirings, an antenna coil is easily implemented that has a coil structure with a comparatively large height dimension and excellent in a degree of freedom in design of coil opening size. By using metal pins for a portion of the patterns defining the antenna coil, the antenna coil is reduced in resistance and, therefore, the highly-sensitivity wireless IC device capable of being miniaturized is acquired.

The circuit substrate 1 is buried away from the antenna coil in the element body 70. Therefore, a space is provided between the circuit substrate 1 and the element body 70 on the second surface PS2 side of the circuit substrate 1.

According to the wireless IC device 101, this space is effectively utilized to mount the mounted components such as the RFIC element 61 and the capacitors on the second surface PS2 side of the circuit substrate 1. Therefore, the surface mounted components are able to be disposed in the space between the circuit substrate 1 and the antenna coil to achieve the miniaturization of the wireless IC device 101. Alternatively, the surface mounted components are able to be mounted on both the first surface PS1 and the second surface PS2 of the circuit substrate 1.

A portion of the antenna coil includes the metal pins. The metal pins are able to make the direct current resistance component of the metal pins themselves sufficiently smaller than DCR of a conductive film of a sintered metal body acquired by sintering of a conductive paste or a thin-film metal body acquired by etching of a conductive thin film. Therefore, the wireless IC device 101 includes the antenna coil with a high Q-value, i.e., a low loss.

Among the patterns defining the antenna coil, the first wiring patterns 20A to 20G and the second wiring patterns 50A to 50F extending in the X-axis direction are able to be increased in film thickness by forming the plating films of Cu etc., so as to further reduce the direct current resistance component of the coil.

Since the capacitors 62, 63, 64 connected to the RFIC element 61 are included, a circuit is easily provided to perform matching, or setting a resonance frequency, between the RFIC element and the antenna coil, and an external circuit is able to be eliminated or simplified.

Since the RFIC element 61, the surface mounted chip components such as the chip capacitors 62, 63, 64, the first metal pins 30A to 30F, and the second metal pins 40A to 40F are protected by the element body 70, the entire wireless IC device 101 is robust. Particularly, if the wireless IC device 101 is buried in a resin molded article, solder connection portions of the surface mounted chip components are protected against a high-temperature resin flowing at the time of injection molding. Although the resin flowing at the time of injection molding momentarily reaches a high temperature of about 300° C. or more, for example, since the RFIC element 61 itself is buried in the element body 70, and the bonding portions between the RFIC element 61 and the circuit substrate 1 are also buried in the element body 70, the reliability is not impaired in the RFIC element 61 and the wireless IC device 101.

Since the RFIC element 61 is not exposed outside the wireless IC device 101, a protection function for the RFIC element 61 is enhanced, and an increase in size due to mounting the RFIC element 61 on the outside is avoided. Additionally, the reliability is enhanced in the connection portion of the RFIC element 61 to the circuit substrate 1. As a result, a high heat-resistance wireless IC device is achieved and can be built into a resin molded article of plastic etc., i.e., that is able to withstand high temperature at the time of injection molding. Particularly, in the wireless IC device 101, the circuit substrate 1 equipped with the RFIC element is spaced away from the surface of the element body 70.

Therefore, when the resin molded article made of plastic etc., having the wireless IC device 101 built-in is manufactured by injection molding, the heat of resin at the time of injection molding is hardly transmitted to the circuit substrate 1 and, therefore, the risk of solder splash etc. is significantly reduced or prevented.

The first wiring patterns 20A to 20G and the second wiring patterns 50A to 50F may be screen-printed or patterned on the surface of the element body 70 and are therefore easily formed. Additionally, the connection is easily made from the first wiring patterns 20A to 20G to the first metal pins 30A to 30F and the second metal pins 40A to 40F, and the connection is easily made from the second wiring patterns 50A to 50F to the first metal pins 30A to 30F and the second metal pins 40A to 40F. Moreover, the first conductor 11A and the second conductor 11B of the circuit substrate 1 is easily connected to the first wiring pattern 20A, 20G.

Since the metal pins are not mounted on the circuit substrate 1 in this configuration, it is not necessary to form lands to mount the metal pins on the circuit substrate 1 and the metal pins are able to be arranged at narrow pitches. Therefore, the wireless IC device 101 is able to be miniaturized.

The RFIC element 61 is connected to the antenna coil through the wiring conductor patterns 10A, 10B, the first conductor 11A, and the second conductor 11B provided on the second surface PS2 of the circuit substrate 1. This makes the formation of a bridge pattern easier. Since the RFIC element 61 is connected to the first conductor 11A and the second conductor 11B through the wiring conductor patterns 10A, 10B for routing, the first conductor 11A and the second conductor 11B are able to be located at arbitrary positions on the second surface PS2 of the circuit substrate 1. The RFIC element 61 may directly be connected to the first conductor 11A and the second conductor 11B.

According to the wireless IC device 101, since the opening diameter of the antenna coil is large, communication is able to be performed in a relatively broad positional relationship with the antenna of the communication partner.

Since the first metal pins 30A to 30F and the second metal pins 40A to 40F are respectively arranged in a staggered manner in the arrangement direction at least at the end portions in the coil axis direction, the wireless IC device 101 is able to be reduced in size even when the number of the metal pins is increased to increase the number of turns.

The method of manufacturing the wireless IC device 101 according to the first preferred embodiment achieves the following advantageous effects.

With the method of manufacturing the wireless IC device 101 according to the first preferred embodiment, the wireless IC device 101 is easily manufactured to have reduced interference with the magnetic field of the antenna coil by the RFIC element, a large coil opening area, and excellent electric characteristics such as small direct current resistance.

According to the method of manufacturing the wireless IC device 101, since the first metal pins 30A to 30F and the second metal pins 40A to 40F are strongly fixed by using the pedestal 3 having the adhesive layer 2, the metal pins with a smaller diameter are able to be used in the antenna coil. Therefore, the antenna coil with the large number of windings and high inductance is able to be manufactured. By using the small-diameter metal pins having a comparatively large height dimension, the coil opening area is able to be further increased.

Although the first metal pins 30A to 30F and the second metal pins 40A to 40F have columnar side portions buried in the first side surface VS3 and the second side surface VS4 of the element body 70 in the wireless IC device 101 according to the first preferred embodiment, this configuration is not a limitation. The side portions of the first metal pins 30A to 30F and the second metal pins 40A to 40F may partially be exposed from the first side surface VS3 and the second side surface VS4 of the element body 70.

Although the first metal pins 30A to 30F and the second metal pins 40A to 40F of the first preferred embodiment are separately arranged in the Y-axis direction and are arranged in a staggered manner (in zigzag alignment) when viewed in the Z-axis direction in the described configuration, this is not a limitation. For example, the first metal pins 30A to 30F and the second metal pins 40A to 40F may be arranged in a line.

Although the RFIC element 61 of the first preferred embodiment is described as preferably including an RFIC chip packaged therein, this is not a limitation. For example, the RFIC element 61 may be a bare-chip RFIC. In this case, the RFIC includes Au electrode terminals and is connected by ultrasonic bonding to the circuit substrate 1 at power feeding terminals including Au plating films printed thereon.

Although the matching circuit preferably includes the three capacitors, i.e., the chip capacitors 62, 63, 64, in the wireless IC device 101 according to the first preferred embodiment in the described example, this is not a limitation. In the wireless IC device 101, at least one or more capacitors may be connected in parallel or substantially parallel to the antenna coil as capacitors to set a resonance frequency.

The element body 70 of the first preferred embodiment may include a magnetic powder such as ferrite powder. In this configuration, since the element body 70 has a magnetic property, the overall size required to acquire an antenna coil with a predetermined inductance can be made smaller. If the element body 70 has a magnetic property, the side portions of the first metal pins 30A to 30F and the second metal pins 40A to 40F may be exposed from side surfaces of the element body 70. Such a configuration allows a magnetic field to spread to the surface of the element body 70 with the first metal pins 30A to 30F and the second metal pins 40A to 40F exposed and enables communication in these directions. The element body may be an element body made of a composite magnetic material containing a metal magnetic powder and a resin. With such a configuration, the inductance is able to be made larger and the device is therefore able to be miniaturized.

Although the RFIC element 61 and the capacitors 62, 63, 64 are preferably mounted on the second surface PS2 side of the circuit substrate 1 in the described configuration of the first preferred embodiment, this is not a limitation. The circuit substrate 1 may have the mounted components mounted on the first surface PS1 or may have the mounted components mounted on both the first surface PS1 and the second surface PS2.

Although the wireless IC device 101 includes the plating layers 80A, 80B and the protective layers 90A, 90B in the described configuration of the first preferred embodiment, this is not a limitation. The plating layers 80A, 80B and the protective layers 90A, 90B may be disposed as needed.

Although the RFIC element 61 is mounted on the circuit substrate 1 in the described example of the first preferred embodiment, this is not a limitation. For example, the wireless IC device 101 may have a configuration without the circuit substrate 1. In this case, for example, the first input/output terminal 61a and the second input/output terminal 61b of the RFIC element 61 are directly connected to the first conductor 11A and the second conductor 11B, respectively.

Second Preferred Embodiment

A wireless IC device of a second preferred embodiment according to the present invention will be described with reference to FIG. 10.

Figure 10:
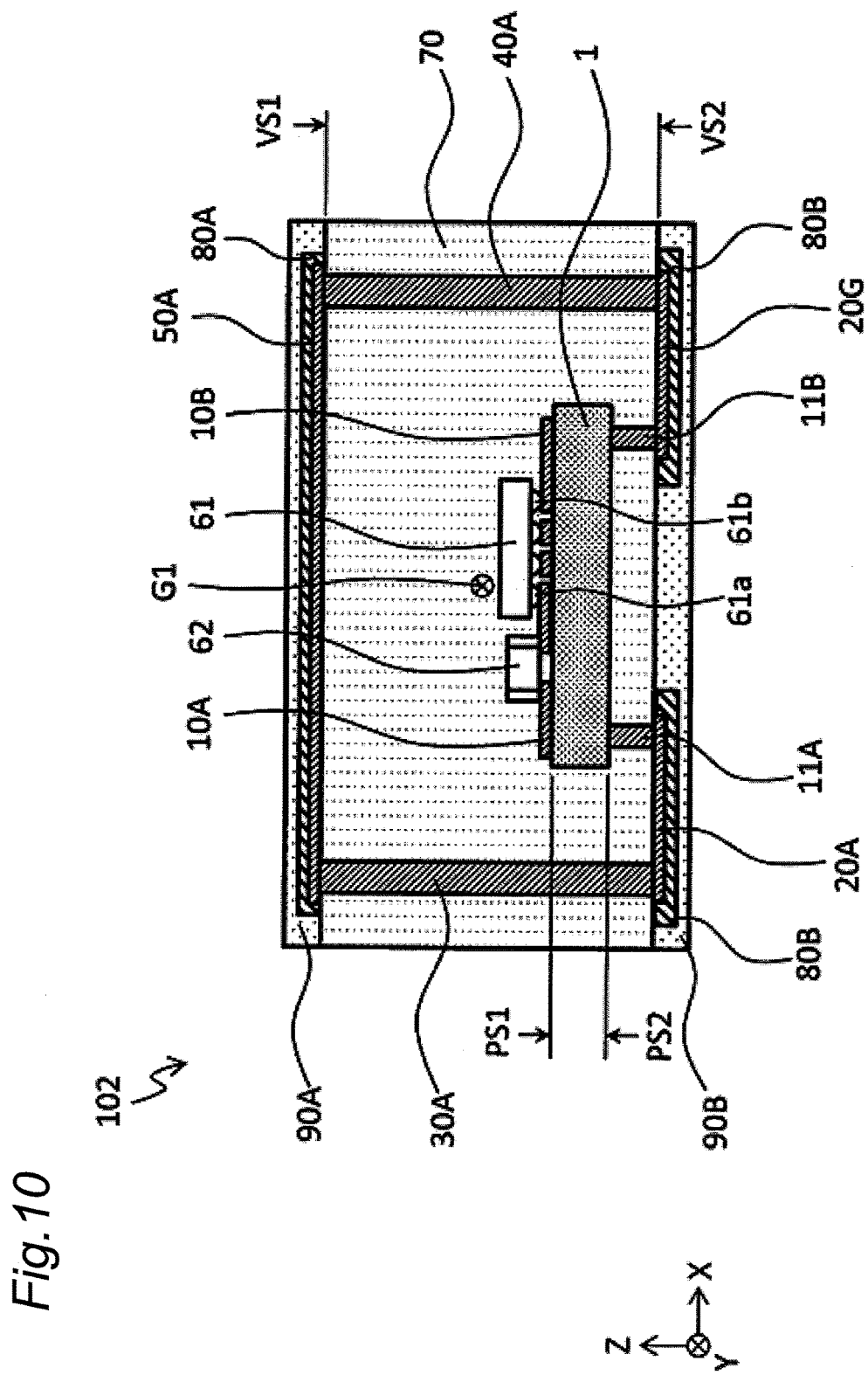
FIG. 10 is a schematic configuration diagram of a wireless IC device of a second preferred embodiment according to the present invention.

FIG. 10 shows a general configuration of a wireless IC device 102 according to the second preferred embodiment. The second preferred embodiment will be described mainly in terms of a difference from the first preferred embodiment. In the second preferred embodiment, the same or equivalent constituent elements as those of the first preferred embodiment are denoted by the same reference numerals in the description. In the second preferred embodiment, the same descriptions as the first preferred embodiment will not be made.

As shown in FIG. 10, the wireless IC device 102 of the second preferred embodiment is different from the wireless IC device 101 of the first preferred embodiment in that the mounted components such as the RFIC element 61 are mounted on the first surface PS1 side of the circuit substrate 1.

The circuit substrate 1 of the wireless IC device 102 includes the wiring conductor patterns 10A, 10B, the power feeding terminals, the NC terminals, the connection terminals 12A, 12B, etc. provided on the first surface PS1 side on which the RFIC element 61 is mounted. When the wireless IC device 102 is viewed in the winding axis G1 direction of the antenna coil, the mounting surface of the RFIC element 61 is provided on the first surface PS1 at a position closer to the winding axis G1 as compared to the second surface PS2.

The wireless IC device 102 according to the second preferred embodiment achieves the following advantageous effects.

The wireless IC device 102 according to the second preferred embodiment includes the mounted components such as the RFIC 61 mounted on the first surface PS1 of the circuit substrate 1. With this configuration, as compared to the first preferred embodiment, the bonding portions between the circuit substrate 1 and the mounted components are more easily disposed closer to the winding axis G1 of the antenna coil than the second principal surface VS2 of the element body 70 when viewed in the winding axis G1 direction of the antenna coil.

For example, in the first preferred embodiment, the first conductor 11A and the second conductor 11B are increased in length in the Z-direction so as to dispose the second surface PS2 of the circuit substrate 1 closer to the winding axis G1 of the antenna coil than the second principal surface VS2 of the element body 70 when viewed in the winding axis G1 direction of the antenna coil. In the second preferred embodiment, the mounting surface of the RFIC element 61 are able to be disposed closer to the winding axis G1 of the antenna coil than the second principal surface VS2 of the element body 70 without increasing the first conductor 11A and the second conductor 11B in length in the Z-direction as in the case of the first preferred embodiment.

Therefore, the wireless IC device 102 according to the second preferred embodiment is more easily enhanced in electric characteristics and thermal characteristics as compared to the first preferred embodiment.

Third Preferred Embodiment

A wireless IC device of a third preferred embodiment according to the present invention will be described with reference to FIG. 11.

Figure 11:
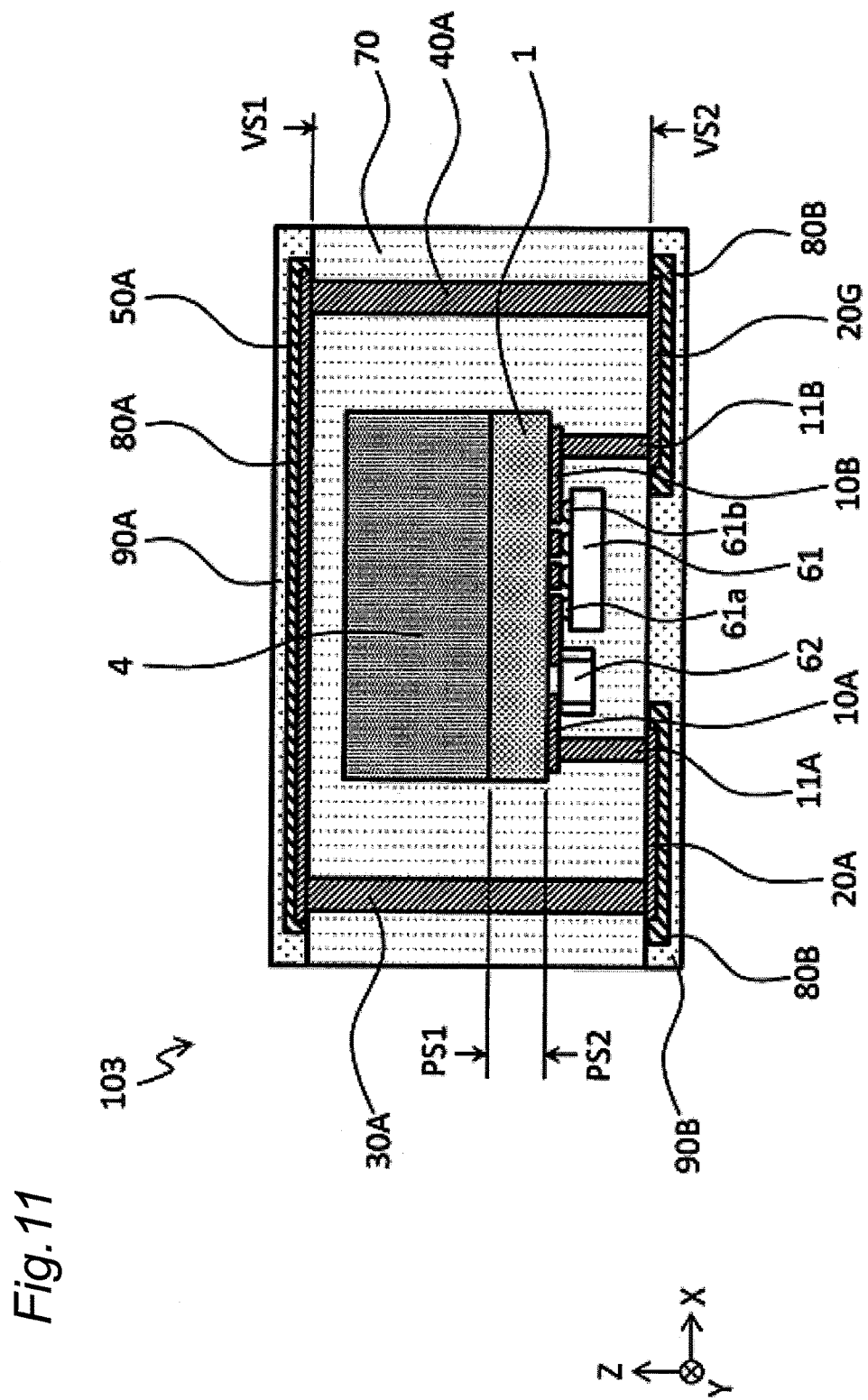
FIG. 11 is a schematic configuration diagram of a wireless IC device of a third preferred embodiment according to the present invention.

FIG. 11 shows a general configuration of a wireless IC device 103 according to the third preferred embodiment. The third preferred embodiment will be described mainly in terms of a difference from the first preferred embodiment. In the third preferred embodiment, the same or equivalent constituent elements as those of the first preferred embodiment are denoted by the same reference numerals in the description. In the third preferred embodiment, the same descriptions as the first preferred embodiment will not be made.

As shown in FIG. 11, the wireless IC device 103 of the third preferred embodiment is different from the wireless IC device 101 of the first preferred embodiment in that a magnetic body 4 is mounted on the first surface PS1 of the circuit substrate 1.

The magnetic body 4 is a ferrite plate such as a ferrite sintered body defining and functioning as a magnetic core for the antenna coil. The magnetic body 4 defines and functions as a magnetic body core of the antenna coil. The magnetic body 4 is mounted on the first surface PS1 of the circuit substrate 1. The magnetic body 4 is preferably a ferrite sintered body including a small size and a magnetic permeability such as a relative permeability of about 50 or more and about 300 or less, for example.

In the third preferred embodiment, the magnetic body 4 is disposed inside the antenna coil, i.e., within a coil winding range, defined by the first metal pins 30A to 30F, the second metal pins 40A to 40F, the first wiring patterns 20A to 20G, and second wiring patterns 50A to 50F.

A method of manufacturing the wireless IC device 103 according to the third preferred embodiment is different from the first preferred embodiment in that at the step of preparing the circuit substrate 1, the magnetic body 4 is mounted on the first surface PS1 of the circuit substrate 1. The other steps of the method of manufacturing the wireless IC device 103 of the third preferred embodiment are the same as the steps of the method of manufacturing the wireless IC device 101 of the first preferred embodiment.

The wireless IC device 103 according to the third preferred embodiment achieves the following advantageous effects.

By disposing the magnetic body 4 within the coil winding range inside the antenna coil, the wireless IC device 103 according to the third preferred embodiment improves the L-value of the antenna coil and improves the antenna performance. Consequently, the antenna coil having a predetermined inductance is acquired without increasing the size of the antenna coil. A predetermined inductance is acquired even when the height of the antenna coil is made lower. The magnetic field coupling to the antenna of the communication partner is enhanced by a magnetism collecting effect of the magnetic body 4.

Since the method of manufacturing the wireless IC device 103 of the third preferred embodiment is able to be implemented by only adding the step of mounting the magnetic body 4 to the method of manufacturing the wireless IC device 101 of the first preferred embodiment, the wireless IC device 103 having the improved L-value of the antenna coil and the improved antenna performance is easily manufactured.

Although the magnetic body 4 preferably is the ferrite plate such as the ferrite sintered body in the described example of the third preferred embodiment, this is not a limitation. The magnetic body 4 may be ferrite rubber containing a ferrite powder, for example.

Fourth Preferred Embodiment

A wireless IC device of a fourth preferred embodiment according to the present invention will be described with reference to FIG. 12.

Figure 12:
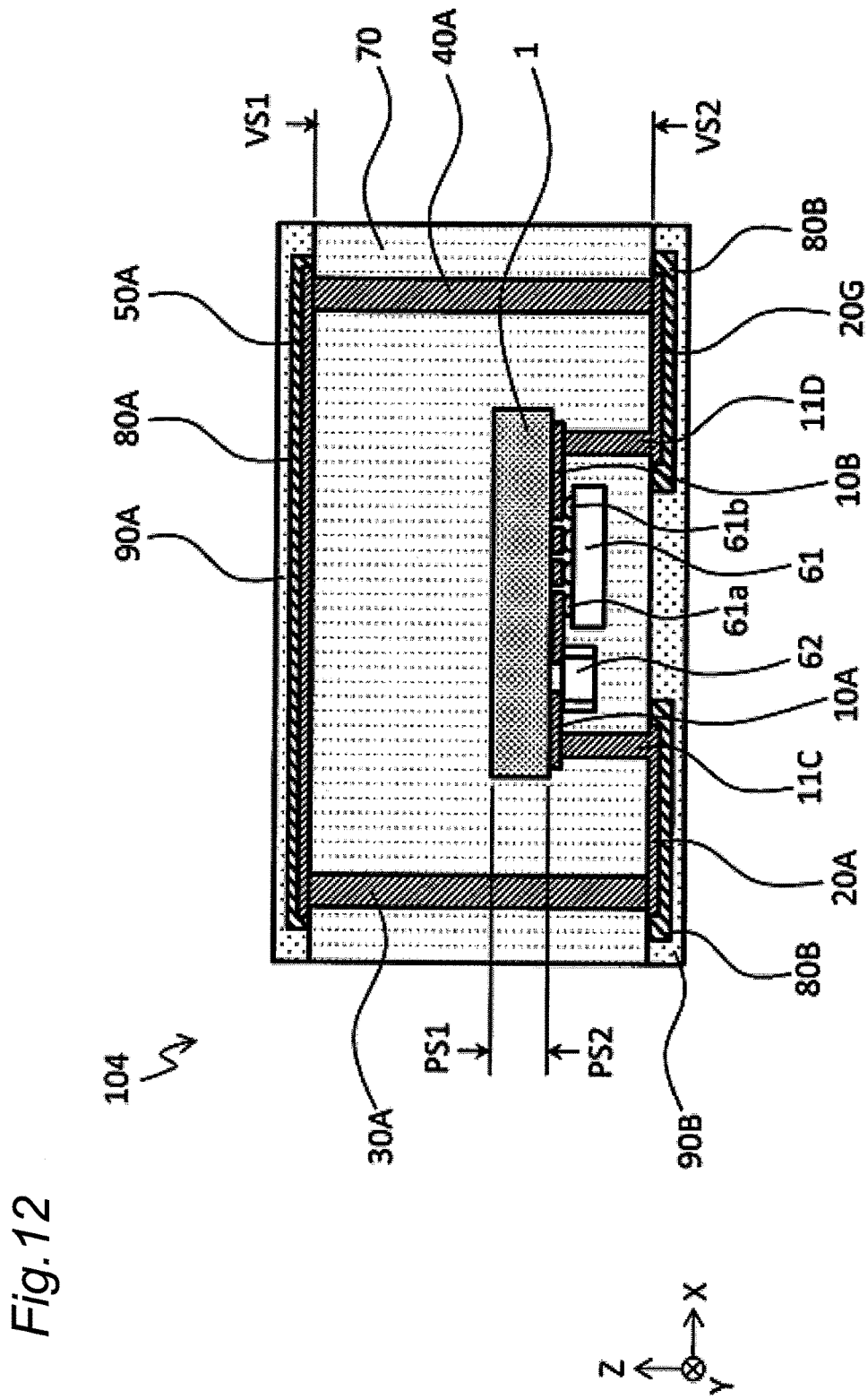
FIG. 12 is a schematic configuration diagram of a wireless IC device of a fourth preferred embodiment according to the present invention.

FIG. 12 shows a general configuration of a wireless IC device 104 according to the fourth preferred embodiment. The fourth preferred embodiment will be described mainly in terms of a difference from the first preferred embodiment. In the fourth preferred embodiment, the same or equivalent constituent elements as those of the first preferred embodiment are denoted by the same reference numerals in the description. In the fourth preferred embodiment, the same descriptions as the first preferred embodiment will not be made.

As shown in FIG. 12, the wireless IC device 104 of the fourth preferred embodiment is different from the wireless IC device 101 of the first preferred embodiment in that a third conductor 11C and a fourth conductor 11D are formed by growth of the plating layer 80B of Cu etc. provided on the first wiring patterns 20A to 20G.

The wireless IC device 104 according to the fourth preferred embodiment achieves the following advantageous effects.

According to the wireless IC device 104 of the fourth preferred embodiment, as compared to the first preferred embodiment, since it is not necessary to mount the metal pins for the third conductor 11C and the fourth conductor 11D, the number of components is reduced to achieve a cost reduction.

Although the third conductor 11C and the fourth conductor 11D preferably are formed by growth of the plating layer 80B in the described configuration of the wireless IC device 104 of the fourth preferred embodiment, this is not a limitation. For example, the third conductor 11C and the fourth conductor 11D may be stud-shaped bumps provided on the connection terminals 12A, 12B of the circuit substrate 1. With such a configuration, the RFIC element 61 and the antenna coil are easily connected without using the metal pins.

Fifth Preferred Embodiment

A wireless IC device of a fifth preferred embodiment according to the present invention will be described with reference to FIGS. 13 to 15.

Figure 13:
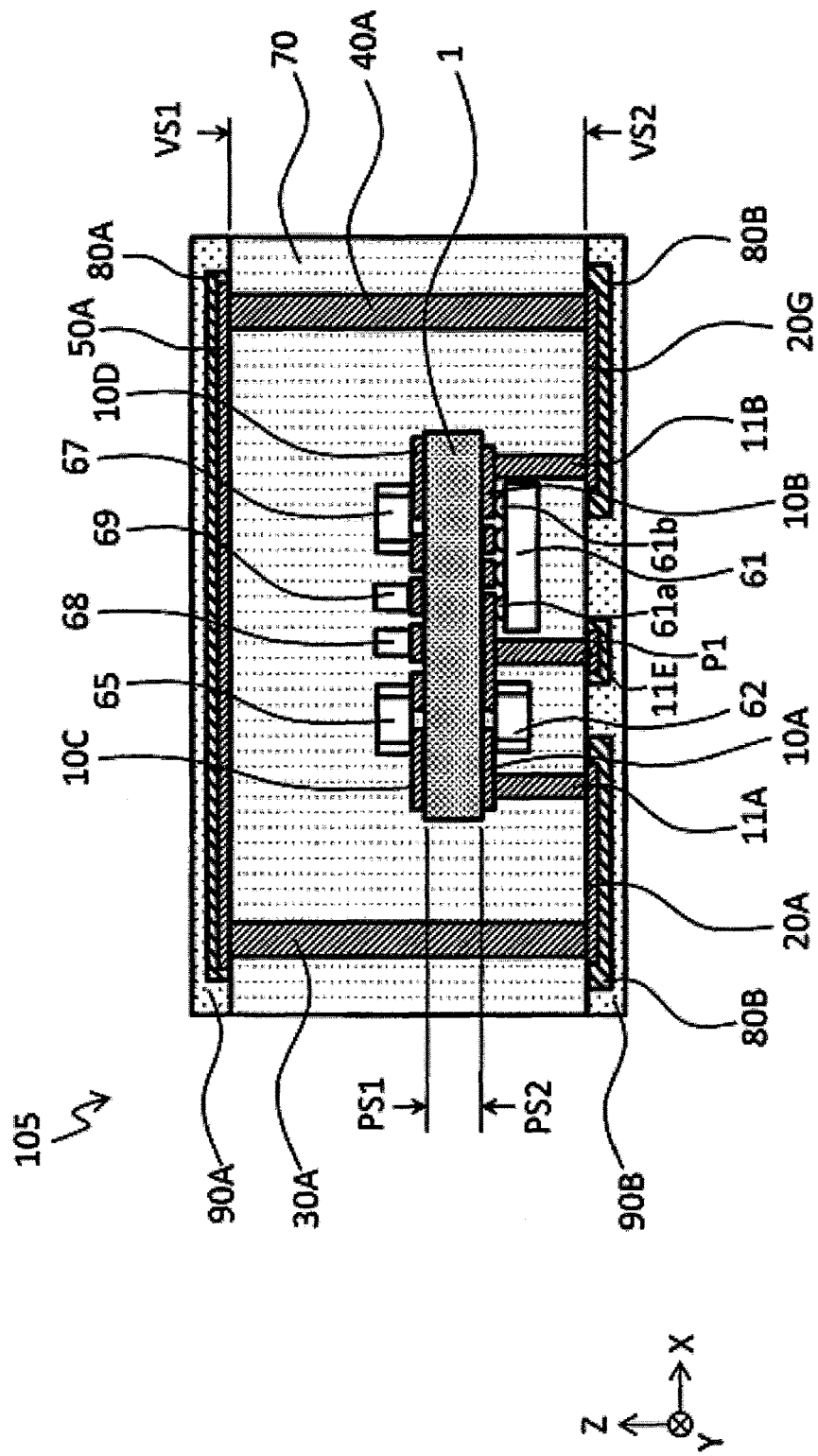
FIG. 13 is a schematic configuration diagram of a wireless IC device of a fifth preferred embodiment according to the present invention.

FIG. 13 shows a general configuration of a wireless IC device 105 according to the fifth preferred embodiment. FIG. 14 is a circuit diagram of the wireless IC device 105 of the fifth preferred embodiment. FIG. 15 is a bottom view of the wireless IC device 105 of the fifth preferred embodiment. The fifth preferred embodiment will be described mainly in terms of a difference from the first preferred embodiment. In the fifth preferred embodiment, the same or equivalent constituent elements as those of the first preferred embodiment are denoted by the same reference numerals in the description. In the fifth preferred embodiment, the same descriptions as the first preferred embodiment will not be made.

As shown in FIG. 13, the wireless IC device 105 of the fifth preferred embodiment is different from the wireless IC device 101 of the first preferred embodiment in that the surface mounted components are mounted on both the first surface PS1 and the second surface PS2 of the circuit substrate 1 and that input/output terminals P1, P2 are provided on the second principal surface VS2 of the element body 70. The fifth preferred embodiment is also different from the first preferred embodiment in that a reader/writer module (hereinafter referred to as the "RW module") is provided.

As shown in FIG. 13, wiring conductor patterns 10C, 10D are further provided on the first surface PS1 of the circuit substrate 1 of the wireless IC device 105, and the surface mounted components such as capacitors 65, 67 and coils 68, 69 are mounted on the wiring conductor patterns 10C, 10D.

The conductor pattern 10B provided on the second surface PS2 is connected through a fifth conductor 11E extending from the second principal surface VS2 of the element body 70 in the direction of the first principal surface VS1, to the input/output terminal P1 provided on the second principal surface VS2 of the element body 70.

For example, the fifth conductor 11E is made of the same material as the first conductor 11A and the second conductor 11B.

A circuit of the wireless IC device 105 of the fifth preferred embodiment will be described.

Figure 14:
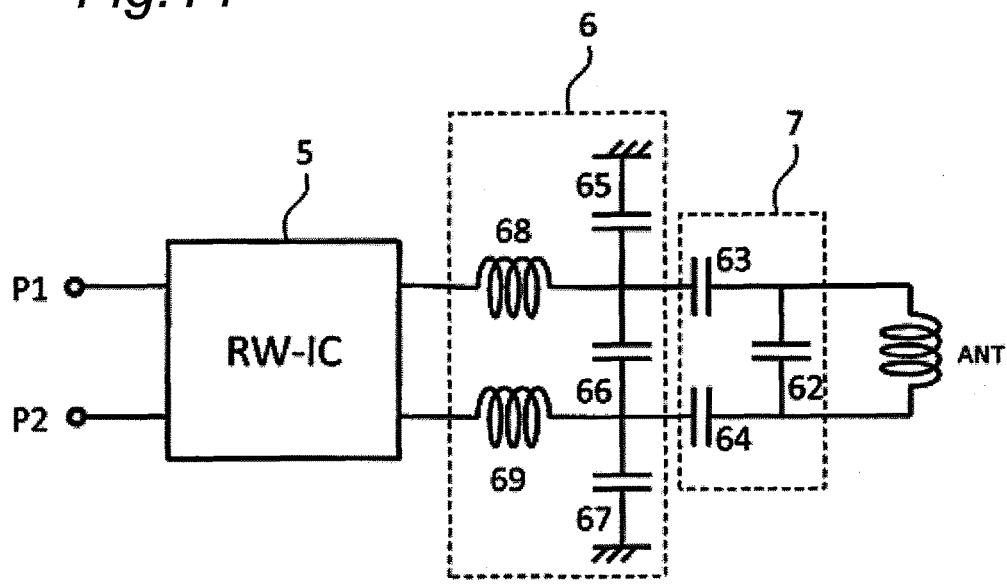
FIG. 14 is a circuit diagram of the wireless IC device of the fifth preferred embodiment according to the present invention.

As shown in FIG. 14, the RW module includes an RW-IC element 5, a low-pass filter (hereinafter referred to as the "LPF") 6, a matching circuit 7, and the antenna coil ANT.

The RW-IC element 5 is a kind of the RFIC element 61 and transmits a predetermined high-frequency signal to the antenna coil ANT. The high-frequency signal preferably is a signal of the 13-MHz band, for example. The RW-IC element 5 converts a base band signal to be transmitted to a communication partner into a predetermined high-frequency signal (positive phase signal) in accordance with a predetermined digital modulation technique. The RW-IC element 5 generates a reverse phase signal having the phase rotated by 180° relative to the positive phase signal and generates a differential signal. The RW-IC element 5 defines and functions as a power feeding circuit to process a high-frequency signal received through the antenna coil ANT and converts a reception signal from the antenna coil ANT into the base band signal in accordance with a predetermined digital modulation technique. The RW-IC element 5 further includes the input/output terminals P1, P2 in addition to the first input/output terminal 61a and the second input/output terminal 61b.

The LPF 6 allows passage of only a low-frequency component equal to or less than a predefined frequency out of the differential signal output from the RW-IC element 5 and transmits a transmission signal to the antenna coil ANT. As a result, the LPF 6 significantly reduces or prevents radiation of an unnecessary high harmonic component from the antenna coil ANT. The LPF 6 includes the capacitors 65, 66, 67 and the coils 68, 69.

The matching circuit 7 including the capacitors 62, 63, 64 and the antenna coil ANT are the same as the first preferred embodiment and will not be described.

In the fifth preferred embodiment, the RW-IC element 5 and the capacitors 62, 63, 64 for the matching circuit 7 are mounted on the second surface PS2 side of the circuit substrate 1. On the other hand, the capacitors 65, 66, 67 for the LPF 6 and the coils 68, 69 are mounted on the first surface PS1 side of the circuit substrate 1.

Figure 15:
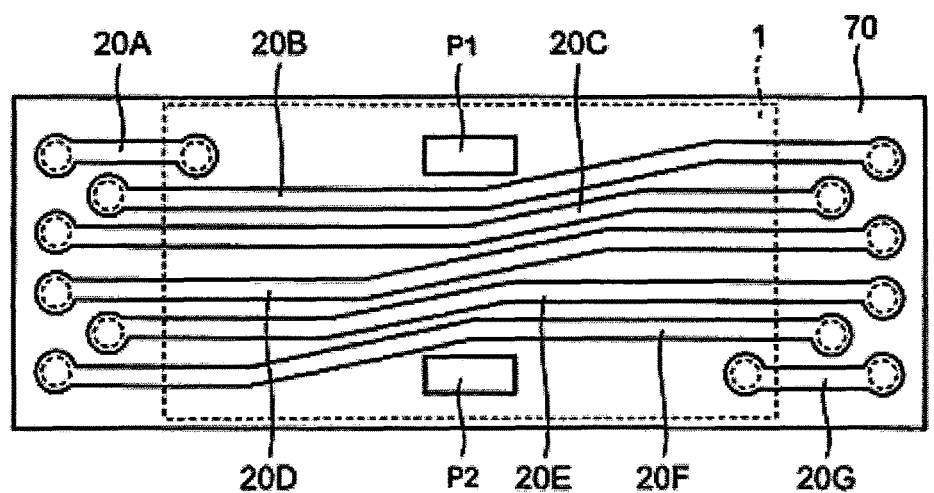
FIG. 15 is a bottom view of the wireless IC device of the fifth preferred embodiment according to the present invention.

As shown in FIG. 15, the input/output terminals P1, P2 led out from the RW-IC element 5 are preferably located near the center of the second principal surface VS2 of the element body 70. The input/output terminals P1, P2 are connected to a microcomputer etc.

The wireless IC device 105 according to the fifth preferred embodiment achieves the following advantageous effects.

According to the wireless IC device 105 of the fifth preferred embodiment, since the surface mounted components are mounted on both the first surface PS1 and the second surface PS2 of the circuit substrate 1, the number of the mounted components is able to be increased without making the size of the wireless IC device itself larger. Additionally, since the input/output terminals P1, P2 are further disposed, the wireless IC device 105 is able to be controlled by the microcomputer etc.

Although the surface mounted components are preferably mounted on both the first surface PS1 and the second surface PS2 of the circuit substrate 1 to form the RW module having the LPF 6 and the matching circuit 7 in the described example of the fifth preferred embodiment, this is not a limitation. For example, in the fifth preferred embodiment, other circuits such as a capacitor cutting a direct-current component may be mounted.

Although the input/output terminals P1, P2 of the RW-IC element 5 preferably are disposed near the center of the second principal surface VS2 of the element body 70 in the described example of the fifth preferred embodiment, this is not a limitation. The input/output terminals P1, P2 may be disposed at arbitrary positions. Such a configuration improves a degree of freedom in design.

Sixth Preferred Embodiment

An RFID-tagged article of a sixth preferred embodiment according to the present invention will be described with reference to FIGS. 16 to 17.

Figure 16:
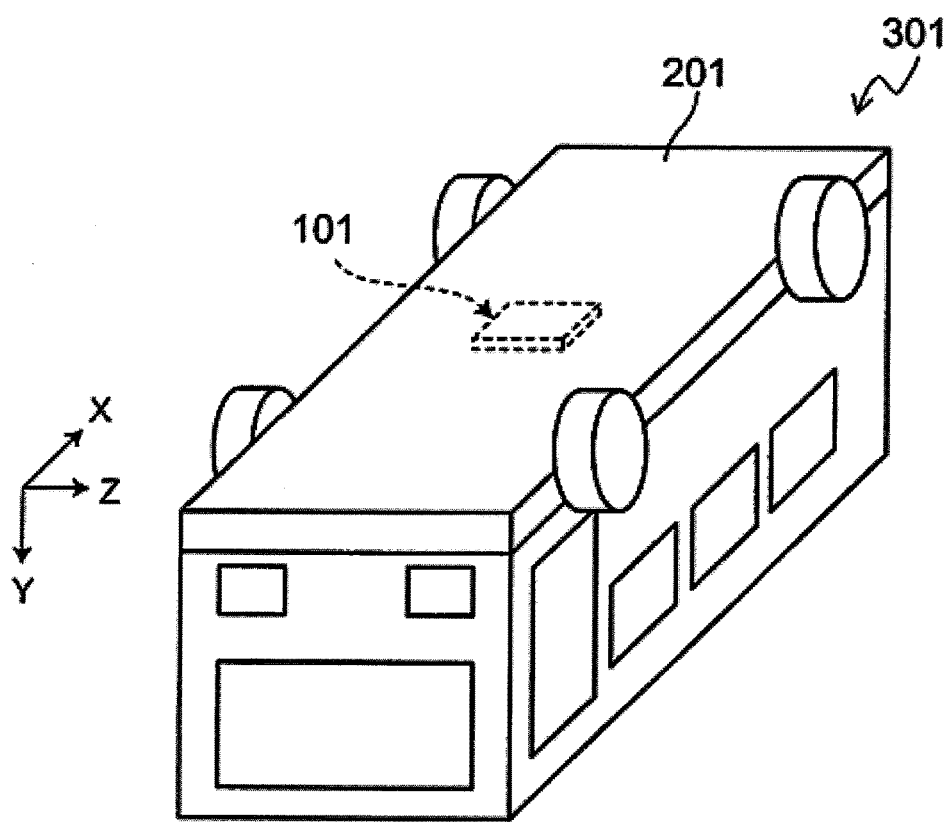
FIG. 16 is a perspective view of an RFID-tagged article of the sixth preferred embodiment according to the present invention.

FIG. 16 is a perspective view of an RFID-tagged article 301 according to the sixth preferred embodiment. FIG. 17 is a front view of the RFID-tagged article 301 according to the sixth preferred embodiment. The RFID-tagged article 301 is a resin molded body including an RFID tag built-in and is, for example, a toy such as a miniature car made by resin molding. The RFID-tagged article 301 includes the wireless IC device 101 of the first preferred embodiment. In the sixth preferred embodiment, the wireless IC device 101 is preferably used as the RFID tag.

Figure 17:
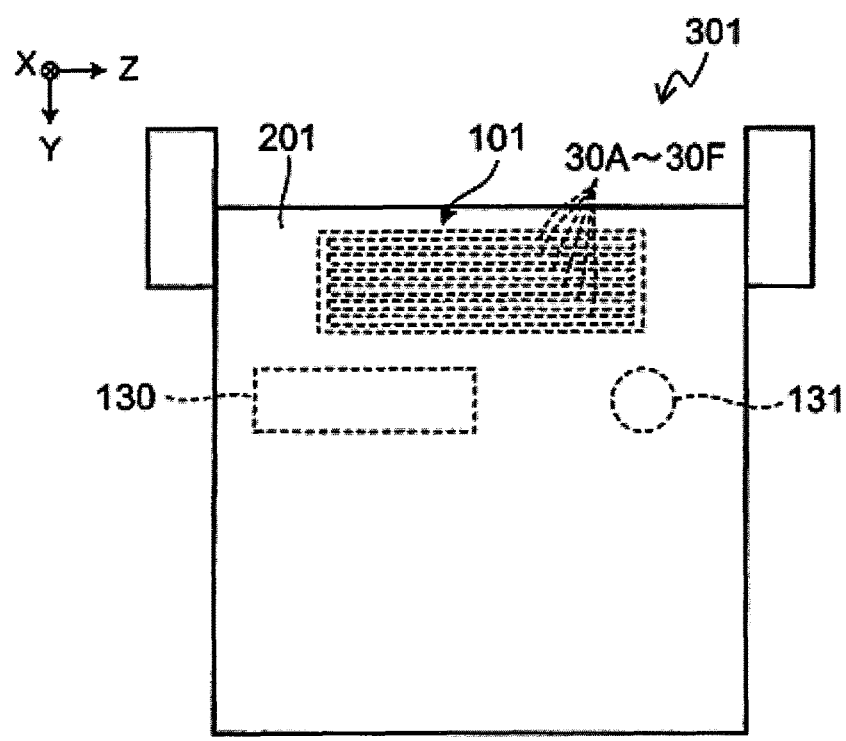
FIG. 17 is a front view of the RFID-tagged article of the sixth preferred embodiment according to the present invention.

As shown in FIGS. 16 and 17, the wireless IC device 101 is buried in a resin molded body 201 and is not exposed outside the article 301. The wireless IC device 101 is buried in a bottom portion of the toy. The bottom portion of the toy corresponds to near an upper surface of the RFID-tagged article 301 from the point of view of FIG. 17.

The winding axis of the antenna coil of the wireless IC device 101 faces in the normal direction to the bottom surface of the toy such as a miniature car. Therefore, by bringing the bottom surface of the toy to face a reading portion of a reader/writer apparatus, the reader/writer apparatus communicates with the wireless IC device 101. As a result, the reader/writer apparatus or a host apparatus connected to the reader/writer apparatus executes a predetermined process.

Figure 18:
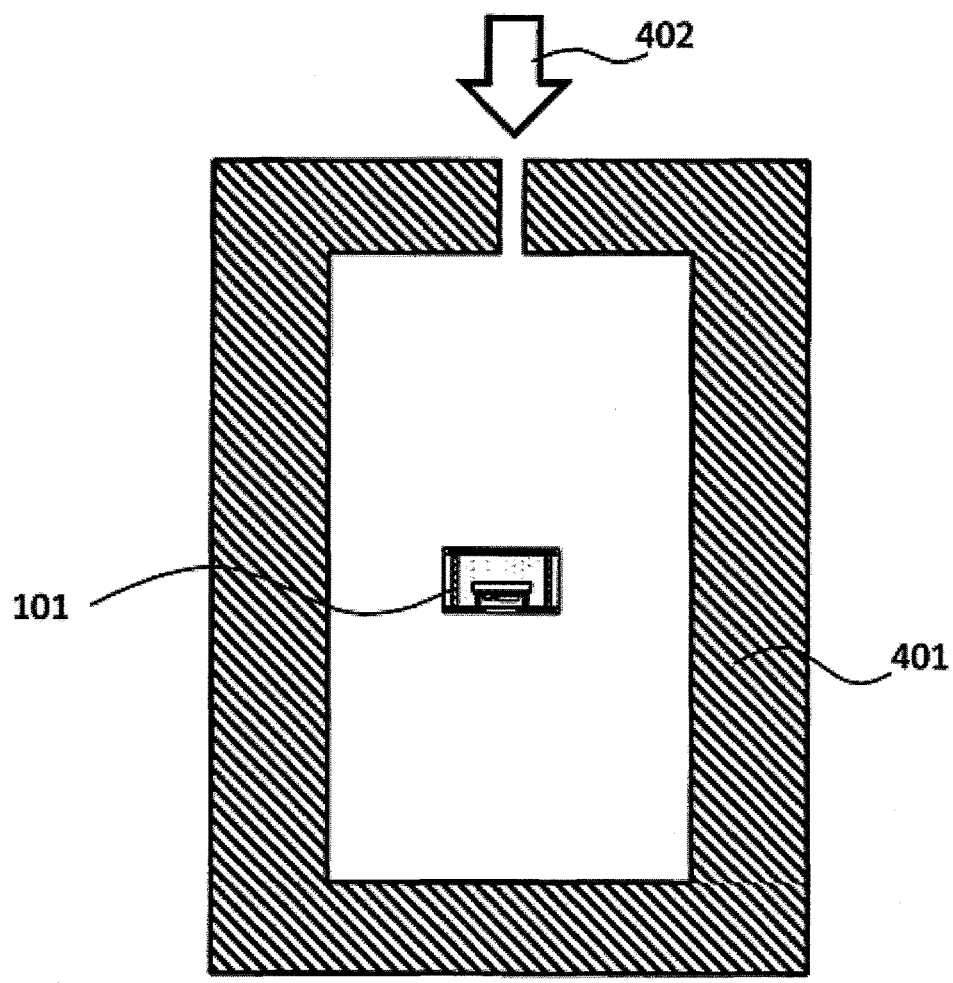
FIG. 18 is a diagram of a manufacturing step of injection molding of the RFID-tagged article of the sixth preferred embodiment according to the present invention.

A method of manufacturing the RFID-tagged article 301 will be described with reference to FIG. 18. FIG. 18 shows a step manufacturing the RFID-tagged article 301 according to the sixth preferred embodiment by injection molding.

As shown in FIG. 18, an injection mold 401 of the resin molded body 201 is prepared, and the wireless IC device 101 is fixed inside the injection mold 401. The wireless IC device 101 is fixed inside the injection mold 401 by a support member etc. made of the same resin as an injection molding resin 402, for example. The injection molding resin 402 is injected from a gate into the injection mold 401 to mold the resin molded body 201, and the RFID-tagged article 301 is thus manufactured.

Since the RFIC element 61 etc. are protected by the element body 70 as is the case with the wireless IC device according to the other preferred embodiments, the wireless IC device 101 is robust. The solder connection portions of the surface mounted chip components are protected against the injection molding resin 402 flowing at high temperature at the time of injection molding. In the case of a normal winding coil component acquired by winding Cu wires coated with polyimide-based resin films, the coating melts due to heat at the time of injection molding, and a short circuit occurs between the Cu wires. Therefore, it is difficult to use a conventional normal winding coil component as the antenna coil.

When viewed in the winding axis G1 direction of the antenna coil, the circuit substrate 1 of the wireless IC device 101 is disposed closer to the winding axis G1 than the second principal surface VS2 of the element body 70. Therefore, the circuit substrate 1 of the wireless IC device 101 is disposed at a certain distance away from the outer edge of the element body 70 brought into contact with the high-temperature injection molding resin 402. Therefore, when the RFID-tagged article 301 is molded, the wireless IC device 101 is hardly affected by the thermal effect and, therefore, the RFID-tagged article 301 excellent in electric characteristics and thermal characteristics is provided.

The RFID-tagged article 301 according to the sixth preferred embodiment achieves the following advantageous effects.

According to the sixth preferred embodiment, the RFID-tagged article 301 is capable of communication with a reader/writer apparatus etc. and excellent in electric characteristics and thermal characteristics.

Seventh Preferred Embodiment

An RFID-tagged article of a seventh preferred embodiment according to the present invention will be described with reference to FIGS. 19 to 21.

Figure 19:
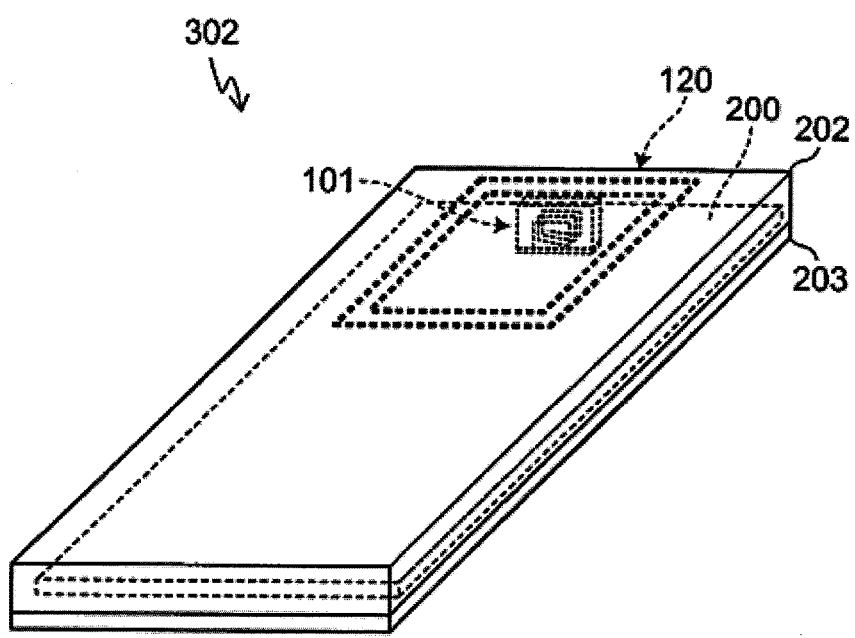
FIG. 19 is a perspective view of an RFID-tagged article of the seventh preferred embodiment according to the present invention.
Figure 20:
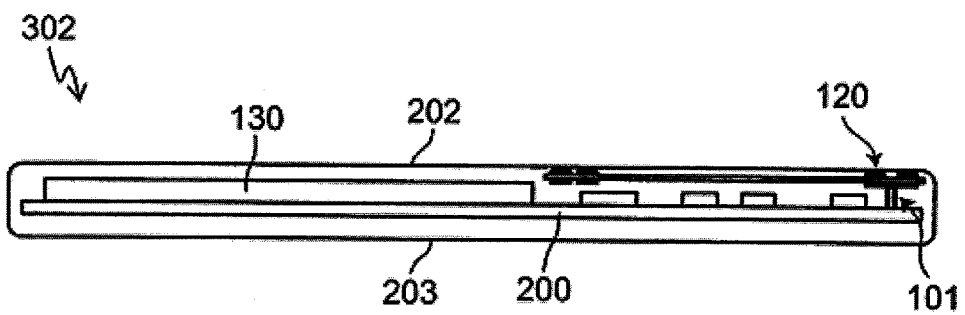
FIG. 20 is a cross-sectional view of the RFID-tagged article of the seventh preferred embodiment according to the present invention.

FIG. 19 is a perspective view of an RFID-tagged article 302 according to the seventh preferred embodiment. FIG. 20 is a cross-sectional view of the RFID-tagged article 302. FIG. 21 is a partial enlarged view of FIG. 20.

The RFID-tagged article 302 is a communication terminal apparatus equipped with an RFID tag and is, for example, a portable electronic device such as a smartphone. The RFID-tagged article 302 includes the wireless IC device 101 and a booster antenna 120 having a resonance frequency. As shown in FIGS. 19 and 20, the RFID-tagged article 302 includes a lower housing 202 on the upper surface side and an upper housing 203 on the lower surface side. A circuit substrate 200, the wireless IC device 101, and the booster antenna 120 having a resonance frequency are included inside a space surrounded by the lower housing 202 and the upper housing 203.

The wireless IC device 101 is as described in the first preferred embodiment. The wireless IC device 101 is mounted on the circuit substrate 200 as shown in FIGS. 19 and 20. Components other than the wireless IC device 101 are also mounted on the circuit substrate 200.

The booster antenna 120 having a resonance frequency is affixed to an inner surface of the lower housing 202. The booster antenna 120 is disposed at a position not overlapping with a battery pack 130. The booster antenna 120 includes an insulator base material 123 and coil patterns 121, 122 provided on the insulator base material 123.

Figure 21:
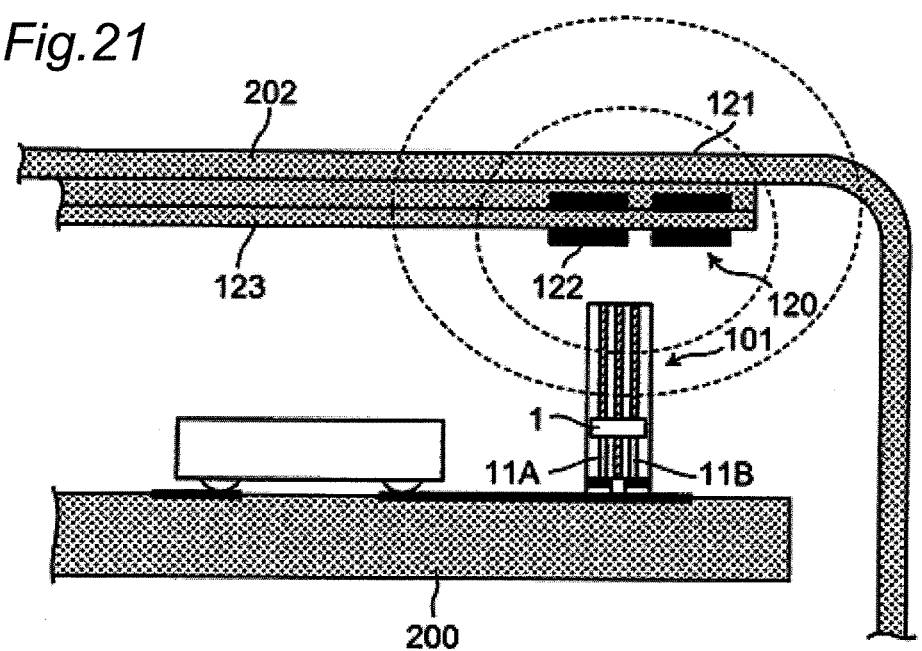
FIG. 21 is a partial enlarged view of the RFID-tagged article of FIG. 20.

As shown in FIG. 21, the wireless IC device 101 is disposed such that magnetic fluxes are interlinked with respect to the antenna coil thereof and the booster antenna 120. In particular, the wireless IC device 101 and the booster antenna 120 are arranged such that the antenna coil of the wireless IC device 101 achieves magnetic coupling to a coil of the booster antenna 120. Broken lines of FIG. 21 conceptually represent the magnetic fluxes contributing to the magnetic coupling.

The RFIC element 61 of the wireless IC device 101 is disposed to face toward the circuit substrate 200 in the vicinity thereof, and the antenna coil is disposed to face toward the booster antenna 120 in the vicinity thereof. Therefore, a degree of coupling is high between the antenna coil of the wireless IC device 101 and the booster antenna 120. Wirings connecting the RFIC element 61 and other circuit elements, particularly, a digital signal line and a power source line are wired in parallel or substantially parallel with the magnetic flux of the antenna coil and, therefore, the coupling to the antenna coil is at a low level.

Figure 22:
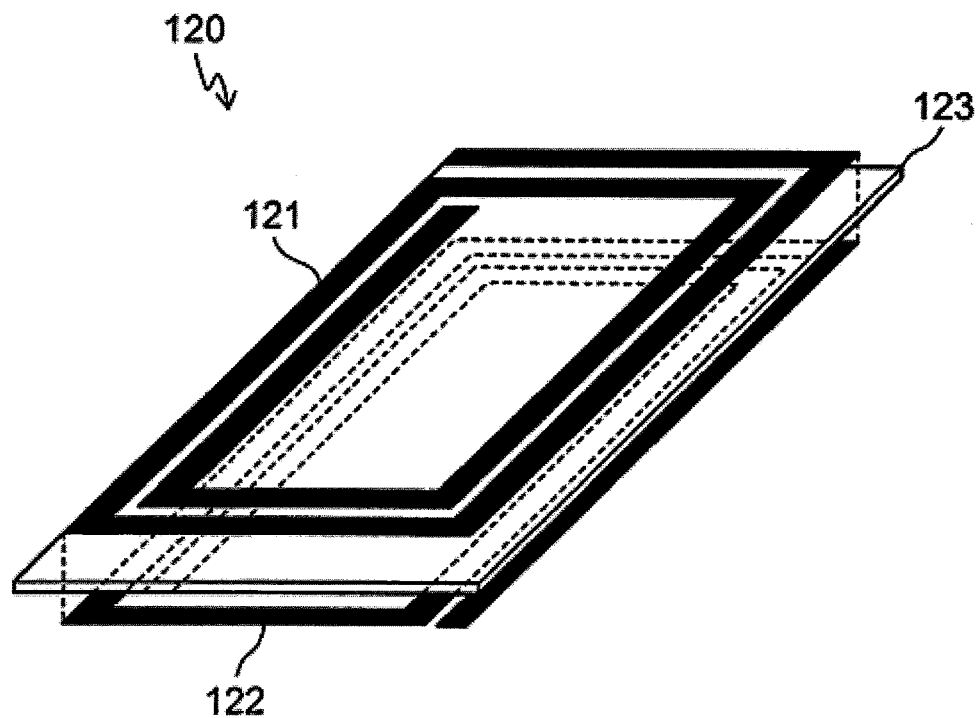
FIG. 22 is a perspective view of a booster antenna in the seventh preferred embodiment according to the present invention.
Figure 23:
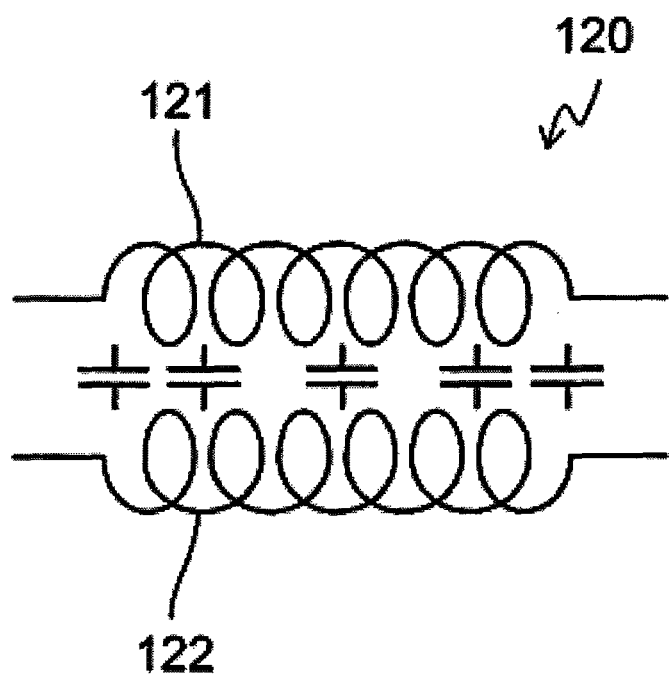
FIG. 23 is a circuit diagram of the booster antenna in the seventh preferred embodiment according to the present invention.

FIG. 22 is a perspective view of the booster antenna 120. FIG. 23 is a circuit diagram of the booster antenna 120. In the booster antenna 120, the first coil pattern 121 and the second coil pattern 122 are conductors each patterned into a rectangular or substantially rectangular spiral shape and are patterned such that the coil patterns are capacitively-coupled while currents flow in the same direction in a planar view. A stray capacitance is generated between the first coil pattern 121 and the second coil pattern 122. An LC resonance circuit includes the inductances of the first coil pattern 121 and the second coil pattern 122 and the capacitance of the stray capacitance. The resonance frequency of this LC resonance circuit is equivalent or substantially equivalent to the communication frequency of this RFID system. The communication frequency preferably is the 13.56-MHz band, for example.

The RFID-tagged article 302 according to the seventh preferred embodiment achieves the following advantageous effects.

The RFID-tagged article 302 of the seventh preferred embodiment communicates by utilizing a large coil opening of the booster antenna and therefore expands a longest communicable distance.

Although the articles including the wireless IC device 101 of the first preferred embodiment have been described in the sixth and seventh preferred embodiments, this is not a limitation. For example, articles may include the wireless IC devices of the second to fifth preferred embodiments.

Although the present invention has been sufficiently described in terms of preferred embodiments with reference to the accompanying drawings, various modifications and corrections are apparent to those skilled in the art. It should be understood that such modifications and corrections are included in the present invention without departing from the scope of the present invention according to the accompanying claims. Preferred embodiments of the present invention are useful for a wireless IC device and reduce the interference with a magnetic field of an antenna coil by an RFIC element while having excellent electric characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
   an element body including a first principal surface and a second principal surface opposite to the first principal surface;
   a circuit substrate having an RFIC element buried in the element body, the RFIC element including a first input/output terminal and a second input/output terminal;
   a first conductor extending in the element body in a direction from the second principal surface to the first principal surface and connected to the first input/output terminal of the RFIC element;

a second conductor extending in the element body in a direction from the second principal surface to the first principal surface and connected to the second input/output terminal of the RFIC element; and an antenna coil disposed in or on the element body and including one end connected to the first conductor and the other end connected to the second conductor; wherein the antenna coil includes:
- a plurality of first wiring patterns provided on the second principal surface side of the element body and connected to the first conductor and the second conductor; and
- a second wiring pattern provided on the first principal surface side of the element body and connected to the first wiring patterns via a plurality of conductors; wherein
- the circuit substrate is disposed inside the antenna coil and spaced away from the antenna coil.

2. The wireless IC device of claim 1, wherein
the first conductor and the second conductor include columnar metal pins;
the first input/output terminal of the RFIC element is connected to the first conductor through a connection terminal provided on the circuit substrate; and
the second input/output terminal of the RFIC element is connected to the second conductor through a connection terminal provided on the circuit substrate.

3. The wireless IC device of claim 2, wherein when viewed in a direction of a winding axis of the antenna coil, the circuit substrate is disposed such that a surface including the first input/output terminal and the second input/output terminal of the RFIC element mounted thereon is closer to the winding axis than the second principal surface of the element body.

4. The wireless IC device of claim 1, wherein
the circuit substrate includes a first surface facing the first principal surface of the element body and a second surface facing the second principal surface of the element body;
the RFIC element is mounted on the second surface of the circuit substrate.

5. The wireless IC device of claim 1, wherein the circuit substrate includes a magnetic body that defines and functions as a magnetic body core of the antenna coil.

6. The wireless IC device of claim 1, wherein the plurality of conductors connecting the second wiring pattern to the first wiring patterns include a first metal pin and a second metal pin reaching the first principal surface and the second principal surface of the element body and connecting the second wiring pattern to the first wiring patterns.

7. The wireless IC device of claim 6, wherein
each of the first and second wiring patterns is one of a plurality of wiring patterns;
each of the first and second metal pins is one of a plurality of metal pins; and
the antenna coil has a helical shape including a plurality of loops including the first wiring patterns, the second wiring patterns, the first metal pins, and the second metal pins.

8. The wireless IC device of claim 7, wherein
each of the first and second metal pins is one of three or more metal pins; and
the first metal pins and the second metal pins are separately arranged in a Y-axis direction and are disposed in a staggered manner when viewed in a Z-axis direction.

9. The wireless IC device of claim 8, wherein
the antenna coil includes a plurality of loops different in inner/outer diameter when viewed in the Y-axis direction;
a loop located in an opening plane of the antenna coil is a loop with a largest inner/outer diameter out of the plurality of loops.

10. A resin molded body comprising:
a wireless IC device including:
an element body including a first principal surface and a second principal surface opposite to the first principal surface;
a circuit substrate having an RFIC element buried in the element body, the RFIC element including a first input/output terminal and a second input/output terminal;
a first conductor extending in the element body in a direction from the second principal surface to the first principal surface and connected to the first input/output terminal of the RFIC element;
a second conductor extending in the element body in a direction from the second principal surface to the first principal surface and connected to the second input/output terminal of the RFIC element; and
an antenna coil disposed in or on the element body and including one end connected to the first conductor and the other end connected to the second conductor; wherein
the antenna coil includes:
- a plurality of first wiring patterns provided on the second principal surface side of the element body and connected to the first conductor and the second conductor of the RFIC element; and
- a second wiring pattern provided on the first principal surface side of the element body and connected to the first wiring patterns via a plurality of conductors; wherein
- the circuit substrate is disposed inside the antenna coil and spaced away from the antenna coil.

11. The resin molded body of claim 10, wherein
the first conductor and the second conductor include columnar metal pins;
the first input/output terminal of the RFIC element is connected to the first conductor through a connection terminal provided on the circuit substrate; and
the second input/output terminal of the RFIC element is connected to the second conductor through a connection terminal provided on the circuit substrate.

12. The resin molded body of claim 11, wherein when viewed in a direction of a winding axis of the antenna coil, the circuit substrate is disposed such that a surface including the first input/output terminal and the second input/output terminal of the RFIC element mounted thereon is closer to the winding axis than the second principal surface of the element body.

13. The resin molded body of claim 10, wherein
the circuit substrate includes a first surface facing the first principal surface of the element body and a second surface facing the second principal surface of the element body;
the RFIC element is mounted on the second surface of the circuit substrate.

14. The resin molded body of claim 10, wherein the circuit substrate includes a magnetic body that defines and functions as a magnetic body core of the antenna coil.

15. The resin molded body of claim 10, wherein the plurality of conductors connecting the second wiring pattern to the first wiring patterns include a first metal pin and a second metal pin reaching the first principal surface and the second principal surface of the element body and connecting the second wiring pattern to the first wiring patterns.

16. The resin molded body of claim 15, wherein
each of the first and second wiring patterns is one of a plurality of wiring patterns;
each of the first and second metal pins is one of a plurality of metal pins; and
the antenna coil has a helical shape including a plurality of loops including the first wiring patterns, the second wiring patterns, the first metal pins, and the second metal pins.

17. The resin molded body of claim 16, wherein
each of the first and second metal pins is one of three or more metal pins; and
the first metal pins and the second metal pins are separately arranged in a Y-axis direction and are disposed in a staggered manner when viewed in a Z-axis direction.

18. The resin molded body of claim 17, wherein
the antenna coil includes a plurality of loops different in inner/outer diameter when viewed in the Y-axis direction;
a loop located in an opening plane of the antenna coil is a loop with a largest inner/outer diameter out of the plurality of loops.

19. A communication terminal apparatus comprising:
a wireless IC device including:
an element body including a first principal surface and a second principal surface opposite to the first principal surface;
a circuit substrate having an RFIC element buried in the element body, the RFIC element including a first input/output terminal and a second input/output terminal;
a first conductor extending in the element body in a direction from the second principal surface to the first principal surface and connected to the first input/output terminal of the RFIC element;
a second conductor extending in the element body in a direction from the second principal surface to the first principal surface and connected to the second input/output terminal of the RFIC element; and
an antenna coil disposed in or on the element body and including one end connected to the first conductor and the other end connected to the second conductor; wherein
the antenna coil includes
a plurality of first wiring patterns provided on the second principal surface side of the element body and connected to the first conductor and the second conductor of the RFIC element; and
a second wiring pattern provided on the first principal surface side of the element body and connected to the first wiring patterns via a plurality of conductors; wherein
the circuit substrate is disposed inside the antenna coil and spaced away from the antenna coil.

20. A method of manufacturing a wireless IC device, the method comprising:
arranging a first conductor and a second conductor standing on an adhesive layer disposed on a pedestal, the first conductor being connected to a first input/output terminal of an RFIC element, the second conductor being connected to a second input/output terminal of the RFIC element;
arranging on the adhesive layer a first metal pin including a first end and a second end and a second metal pin including a third end and a fourth end, the first metal pin and the second metal pin standing with the first end side and the third end side located on the adhesive layer side;
coating with an element body the RFIC element, the first conductor, the second conductor, the first metal pin, and the second metal pin arranged on the adhesive layer;
forming on a first principal surface side of the element body a second wiring pattern connecting the second end of the first metal pin and the fourth end of the second metal pin;
removing the pedestal provided with the adhesive layer to form on a second principal surface side of the element body a first wiring pattern connecting the first end of the first metal pin and the third end of the second metal pin while connecting the first conductor and the first end of the first metal pin and connecting the second conductor and the third end of the second metal pin.

* * * * *